United States Patent
Brick et al.

(10) Patent No.: US 12,381,076 B2
(45) Date of Patent: Aug. 5, 2025

(54) INHERENT AREA SELECTIVE DEPOSITION OF SILICON-CONTAINING DIELECTRIC ON METAL SUBSTRATE

(71) Applicant: Gelest, Inc., Morrisville, PA (US)

(72) Inventors: Chad Michael Brick, Yardley, PA (US); Tomoyuki Ogata, Yardley, PA (US)

(73) Assignee: GELEST, INC., Morrisville, PA (US)

( * ) Notice: Subject to any disclaimer, the term of this patent is extended or adjusted under 35 U.S.C. 154(b) by 0 days.

(21) Appl. No.: 18/791,575

(22) Filed: Aug. 1, 2024

(65) Prior Publication Data
US 2025/0095982 A1    Mar. 20, 2025

Related U.S. Application Data

(60) Provisional application No. 63/536,743, filed on Sep. 6, 2023.

(51) Int. Cl.
*H01L 21/02* (2006.01)

(52) U.S. Cl.
CPC .. *H01L 21/02211* (2013.01); *H01L 21/02164* (2013.01); *H01L 21/02214* (2013.01); *H01L 21/0228* (2013.01)

(58) Field of Classification Search
None
See application file for complete search history.

(56) References Cited

U.S. PATENT DOCUMENTS

| | | | |
|---|---|---|---|
| 11,450,529 B2 | 9/2022 | Longrie et al. | |
| 11,643,720 B2 | 5/2023 | Illiberi et al. | |
| 11,728,164 B2 | 8/2023 | Tois et al. | |
| 11,830,732 B2 | 11/2023 | Maes et al. | |
| 2018/0211833 A1 | 7/2018 | Li et al. | |
| 2019/0157079 A1* | 5/2019 | Ke | H01L 21/02323 |
| 2020/0013615 A1 | 1/2020 | Hausmann et al. | |
| 2021/0134586 A1* | 5/2021 | Maes | H01L 21/31116 |
| 2021/0358745 A1* | 11/2021 | Maes | H01L 21/02118 |
| 2023/0154757 A1* | 5/2023 | Lionti | H01L 21/32 |
| | | | 438/674 |

OTHER PUBLICATIONS

International Search Report and Written Opinion issued Dec. 17, 2024 in International Application No. PCT/US2024/040492.
Chen et al., "Investigation of Self-Assembled Monolayer Resists for Hafnium Dioxide Atomic Layer Deposition," Chemistry of Materials, vol. 17, No. 3, pp. 536-544 (2005).
Cho et al., "Inherent selective pulsed chemical vapor deposition of aluminum oxide in nm scale," Applied Surface Science, vol. 622, No. 156824, 10 pages (2023).

(Continued)

*Primary Examiner* — Asok K Sarkar
(74) *Attorney, Agent, or Firm* — Panitch Schwarze Belisario & Nadel LLP

(57) ABSTRACT

An inherently selective process for the deposition of silicon-containing dielectric layers on metal layers includes atomic layer deposition or chemical vapor deposition utilizing a chemical precursor comprising silicon and sulfur, and an oxidant. An optional buffer layer may be present between the metal layer and the selectively deposited film.

37 Claims, 7 Drawing Sheets

(56) References Cited

OTHER PUBLICATIONS

Li et al., "Inherently Area-Selective Atomic Layer Deposition of Manganese Oxide through Electronegativity-Induced Adsorption," Molecules, vol. 26, No. 3056, 11 pages (2021).

Liu et l., "Sequential Use of Orthogonal Self-Assembled Monolayers for Area-Selective Atomic Layer Deposition of Dielectric on Metal," Advanced Materials Interfaces, vol. 10, No. 2202134, 9 pages (2023).

Oh et al., "Low-Temperature Dual-Material Area-Selective Deposition: Molybdenum Hexafluoride-Mediated SiO2 Fluorination/Passivation for Self-Aligned Molybdenum/Metal Oxide Nanoribbons," Advanced Functional Materials, No. 2316872, 12 pages (2024).

Singh et al., "Area-Selective Atomic Layer Deposition of Metal Oxides on Noble Metals through Catalytic Oxygen Activation," Chemistry of Materials, vol. 30, pp. 663-670 (2018).

\* cited by examiner

INHERENT AREA SELECTIVE DEPOSITION OF SILICON-CONTAINING DIELECTRIC ON METAL SUBSTRATE

CROSS-REFERENCE TO RELATED APPLICATION

This application claims priority to U.S. Provisional Patent Application No. 63/536,743, filed Sep. 6, 2023, the disclosure of which is herein incorporated by reference in its entirety.

BACKGROUND OF THE INVENTION

In order to create functional semiconductor devices, it is often necessary to deposit insulating oxide layers on metal structures such as interconnects, gate electrodes, and contact pads. However, depositing oxide layers directly and selectively on metal surfaces in the presence of other oxide or nitride layers can be a challenging process due to the differences in reactivity and surface energies between the deposited material and target substrate and the similarity of the deposited material to the non-targeted surfaces. In particular, deposition of an oxide layer as a dielectric cap layer in recessed trenches has been proposed as a key target area for dielectric-on-metal (DoM) research, due to the difficulty of traditional photolithographic and etch processes to created well-formed, flat dielectric layers at the bottom of trenches.

Current methods of depositing dielectrics on metals utilize photolithography to pattern dielectrics that have been deposited across the entire substrate. However, as feature sizes shrink, alignment errors of the photolithographic masks are becoming an ever-increasing source of device failure. Furthermore, photolithography is a complex process involving many individual process steps and associated costs. Area-Selective Deposition (ASD), which obviates the need for the photolithographic process by depositing desired materials only on targeted areas of the substrate, is an increasingly important area of the semiconductor fabrication process. Many ASD schemes have been published in recent years, but few involve the deposition of dielectrics selectively on metals with other and/or the same dielectric as the non-growth surface, due to the inherent difficulty in developing a chemistry for the deposition of oxide-based dielectrics that is selective to a metal surface with significantly different chemical and physical properties in preference to a dielectric surface with chemical and physical properties similar to the growing layer. Furthermore, to the extent that selective dielectric-on-metal schemes have been reported, many of the metal oxide dielectrics that were deposited, such as $Al_2O_3$, $ZnO$, $Fe_2O_3$, $Ta_2O_5$, or $Mn_3O_4$, have high dielectric constants and thus are not suitable as the dielectric insulators that are required in most semiconductor applications.

It has been found that the selective deposition of dielectrics with low dielectric constant on metals without simultaneous deposition of the dielectric on existing dielectric areas of the substrate presents several unique challenges, among them the chemical similarity of the growing dielectric film and the non-growth surface or surfaces, and the incompatibility of the harsh deposition processes used for dielectric deposition with the blocking layers typically used in ASD schemes. Existing reports of dielectric-on-metal deposition resolve these questions by depositing dielectric layers that have distinct chemistry relative to the existing dielectric layers of the film, which are typically comprised of silica, SiOC low-k dielectrics, silicon nitride, or other silicon-based films. In these reports, oxides such as alumina, zinc oxide, iron oxide, tantalum oxide, or manganese oxide have been deposited selectively on metal relative to dielectric surfaces. However, these oxides have high dielectric constants and limited practical utility.

Several ASD processes for the selective deposition of dielectrics on metal substrates have been reported in the literature, such as in U.S. Pat. Nos. 11,830,732; 11,643,720; 11,450,529; Oh et al. (*Advanced Functional Materials* (2024); Li et al., (*Molecules*, 26, 3056 (2021)); Cho et al., (*Applied Surface Science*, 622 (2023)); Chen et al. (*Chem. Mater.*, 17, 536-544 (2005)); Lui et al., (*Adv. Mater. Interfaces*, 10 (2023)); and Singh et al., (*Chem. Mater.*, 30, 663-670 (2018)). These disclosures are limited to high-k oxides such as alumina, hafnia, zirconia, and oxides of tantalum, iron, nickel, and manganese. Furthermore, few of these reports involve inherent selectivity but rather utilize complicated blocking/unblocking schemes to direct growth of a dielectric onto a target metal surface. While high-k oxides are suitable for some applications, low-k oxides comprising silicon are highly desirable in many applications and device structures.

What is desired is a method for depositing a low dielectric constant film such as $SiO_2$ selectively on the metal areas of a substrate without concomitant deposition on pre-existing dielectric areas of the patterned semiconductor substrate, and more preferably a method to do so that does not require the extra process steps of adding and removing blocking layers on the non-growth surfaces.

SUMMARY OF THE INVENTION

Aspects of the disclosure relate to a method for selectively depositing a silicon-containing dielectric layer upon a patterned substrate, the method comprising:
(a) introducing a patterned substrate into a reaction zone of a deposition chamber, the patterned substrate comprising at least one metallic region and at least one isolated non-metallic region, wherein a temperature of the reaction zone is between about 25° C. and about 500° C.; and
(b) forming a silicon-containing dielectric layer overlaying only the at least one metallic region of the patterned substrate via an atomic layer deposition process or a chemical vapor deposition process, wherein the patterned substrate is exposed to a compound comprising silicon and sulfur, and wherein the patterned substrate is exposed to an oxidant.

Further aspects of the disclosure relate to a second method for selectively depositing a silicon-containing dielectric layer upon a patterned substrate, the method comprising:
(a) introducing a patterned substrate into a reaction zone of a deposition chamber, the patterned substrate having a first layer and a second layer, the first layer comprising at least one metallic region and at least one isolated non-metallic region, and the second layer comprising a buffer material, wherein a temperature of the reaction zone is between about 25° C. and about 500° C.; and
(b) forming a silicon-dielectric layer upon the second layer of the patterned substrate and overlaying only the at least one metallic region of the first layer via an atomic layer deposition or chemical vapor deposition process, wherein the patterned substrate is exposed to a compound comprising silicon and sulfur, and wherein the patterned substrate is exposed to an oxidant.

BRIEF DESCRIPTION OF THE SEVERAL VIEWS OF THE DRAWINGS

The following detailed description of preferred embodiments of the present invention will be better understood when read in conjunction with the appended drawings. For the purposes of illustrating the invention, there is shown in the drawing an embodiment which is presently preferred. It is understood, however, that the invention is not limited to the precise arrangements and instrumentalities shown. In the drawings.

DETAILED DESCRIPTION OF THE INVENTION

Figure 1A:
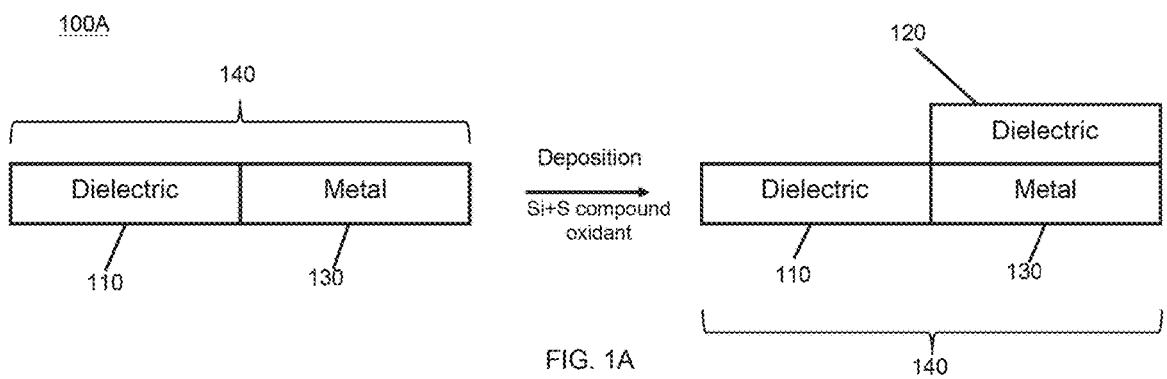
FIG. 1A is a schematic of the process according to one embodiment of the disclosure.

Aspects of the disclosure relate to the use of atomic layer deposition (ALD) or chemical vapor deposition (CVD) processes for selectively depositing silicon-containing dielectric layers upon some or all metal regions of a substrate without significant deposition of additional dielectric upon some or all existing dielectric layers of the same substrate. Specifically, described herein are processes for the selective inherent deposition of silicon-based dielectrics upon patterned metal surfaces with respect to dielectric surfaces of patterned substrates by utilizing silicon-based precursors that contain both silicon and sulfur atoms in combination with an oxidant.

In one embodiment, the disclosure relates to a method for selectively depositing a silicon-containing dielectric layer upon a patterned substrate, the method comprising:
(a) introducing a patterned substrate into a reaction zone of a deposition chamber, the patterned substrate comprising at least one metallic region and at least one isolated non-metallic region, wherein a temperature of the reaction zone is between about 25° C. and about 500° C.; and
(b) forming a silicon-containing dielectric layer overlaying only the at least one metallic region of the patterned substrate via an atomic layer deposition process or a chemical vapor deposition process, wherein the patterned substrate is exposed to a compound comprising silicon and sulfur, and wherein the patterned substrate is exposed to an oxidant.

Unless defined otherwise, all technical and scientific terms used herein have the same meaning as commonly understood to one of ordinary skill in the art to which this invention pertains. Otherwise, certain terms used herein have the meanings as set forth in the specification. All patents, published patent applications and publications cited herein are incorporated by reference as if set forth fully herein.

It must be noted that as used herein and in the appended claims, the singular forms "a," "an," and "the" include plural reference unless the context clearly dictates otherwise.

Unless otherwise stated, any numerical value is to be understood as being modified in all instances by the term "about." Thus, a numerical value typically includes ±10% of the recited value. For example, the recitation of a temperature such as "10° C." includes 9° C. and 11° C. As used herein, the use of a numerical range expressly includes all possible subranges, all individual numerical values within that range, including integers within such ranges and fractions of the values unless the context clearly indicates otherwise.

For the purposes of this disclosure, the term "overlaying" with reference to the silicon-containing dielectric layer overlaying only the at least one metallic region of the patterned substrate may be understood to be synonymous with "covering" or "upon," i.e., the silicon-containing dielectric layer is positioned overlaying/covering/upon the at least one metallic region of the patterned substrate without overlying/covering/being positioned upon the at least one non-metallic region of the patterned substrate. The terms "isolated" and "separated" are synonymous. The term "overlay" and synonyms thereof may be understood to mean directly or indirectly, i.e., with or without at least one layer between them. The terms "upon" and "on" with respect to formation of the silicon-containing dielectric layer are synonymous.

In preferred embodiments, the silicon-containing dielectric layer forms on at least one metallic region of the patterned substrate at a thickness of at least about two nanometers and does not form on at least one non-metallic region of the substrate or forms on at least one non-metallic region of the substrate at a thickness of less than about one nanometer. These embodiments are all contemplated by the dielectric layer forming "only" on the at least one metallic region.

In other preferred embodiments, as described in detail below, at least one layer containing a buffer material (also referred to as a buffer layer) is present between the substrate and the silicon-containing dielectric layer. The silicon-containing dielectric layer still forms selectively on region(s) of the buffer layer which overlay only the metallic region(s), and not on region(s) of the buffer layer which overlay the non-metallic region(s). A metallic region of the substrate which is covered or overlayed by the buffer layer may be referred to as a "buried" metallic region. In other words, the silicon-containing dielectric layer forms in regions proximate to at least one buried metallic region of the substrate, forming a silicon-containing film of at least about two nanometers above, beside or otherwise proximate to the buried metallic region, while forming a silicon-containing film of less than about one nanometer on at least one region of the substrate not above, beside, or proximate to a buried metallic region.

While not limiting, the buffer material in the buffer layer may be comprised of a semiconductor, oxide, nitride, or mixture thereof, such as, without limitation, germanium, aluminum oxide, silicon dioxide, silicon oxycarbide, silicon nitride, silicon oxynitride, silicon carboxynitride, silicon carbide, tantalum nitride, titanium nitride, copper oxide, cobalt oxide, ruthenium oxide, molybdenum oxide, tungsten oxide, or their mixtures. While not limiting, the buffer layer may reduce oxidation or plasma damage of a region of the substrate during the deposition process of the silicon-containing film, or prevent diffusion of atoms such as sulfur atoms from the growing film into the substrate, or diffusion of atoms from the substrate into the growing film.

In the compounds according to the disclosure, the silicon and sulfur moieties may be directly bonded to one another, separated by a linear, branched, or cyclic, optionally substituted, alkylene, aryl, alkyne, alkene, ether, ester, or ketone containing 1 to about 12 carbon atoms, or may comprise part or all of a ring structure. According to aspects of the disclosure, the silicon atom or atoms may additionally be bonded to hydrogen, alkoxy, alkyl, aryl, alkyne, alkene, alkylthio, or alkylamino groups having 1 to about 12 carbon atoms. Further, the sulfur atom or atoms may be bonded to hydrogen, alkyl, aryl, alkyne, alkene, alkylthio, or alkylamino groups having 1 to about 12 carbon atoms and may be in the form of, for example and without limitation, thiols, alkane thiols, sulfonic acids, sulfonamides, thiocyanates or polysulfides such as disulfides or tetrasulfides.

In preferred embodiments, the compound containing silicon and sulfur has at least one direct silicon-sulfur bond or a silicon and sulfur atom connected by a linear, branched, or cyclic, optionally substituted, alkylene, aryl, alkyne, alkene, ether, ester, or ketone having 1 to about 6 carbon atoms, and more preferably has Formula 1, Formula 2, Formula 3, Formula 4, Formula 5, Formula 6, Formula 7, or Formula 8:

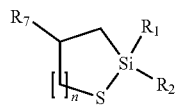

Formula 1

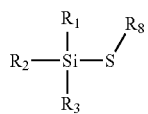

Formula 2

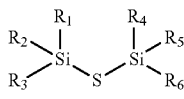

Formula 3

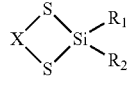

Formula 4

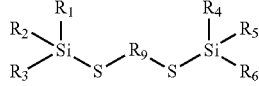

Formula 5

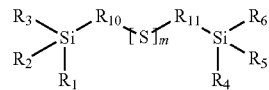

Formula 6

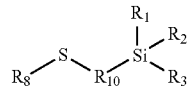

Formula 7

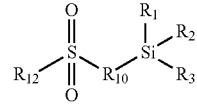

Formula 8

As described in further detail below, in Formulas 1-8, n is an integer from about 1 to 4, m is an integer from about 1 to 6, $R_1$, $R_2$, $R_3$, $R_4$, $R_5$, $R_6$, and $R_7$ are each independently hydrogen or a linear, branched, or cyclic, optionally substituted, alkoxy, alkyl, aryl, alkyne, alkene, ether, ester, ketone, alkylthio, (alkyl)amino, (dialkyl)amino, alkyl(alkylamino), or alkyl(dialkylamino) group having 1 to about 12 carbon atoms (preferably about 1 to about 4 carbon atoms); or a linear, branched, or cyclic, optionally substituted, silyl group having general formula $SiR_{13}R_{14}R_{15}$, $OSiR_{13}R_{14}R_{15}$, or $R_{16}SiR_{13}R_{14}R_{15}$ wherein $R_{13}$, $R_{14}$, and $R_{15}$ are each independently hydrogen or an alkyl or alkoxy group having about 1 to about 12 carbon atoms (preferably about 1 to about 4 carbon atoms); and $R_{16}$ an linear or branched alkyl group having 1 to about 12 carbon atoms (preferably about 1 to 4 carbon atoms); $R_8$ is hydrogen or a linear, branched, or cyclic, optionally substituted, alkyl, aryl, alkyne, alkene, ether, ester, ketone, alkylthio, (alkyl)amino, (dialkyl)amino, alkyl(alkylamino), or alkyl(dialkylamino) group having 1 to about 12 carbon atoms (preferably about 1 to about 4 carbon atoms); or a linear, branched, or cyclic, optionally substituted, silyl group having general formula $SiR_{13}R_{14}R_{15}$, or $R_{16}SiR_{13}R_{14}R_{15}$; $R_9$, $R_{10}$ and $R_{11}$ are each independently a linear, branched, or cyclic, optionally substituted, alkylene, aryl, alkyne, alkene, ether, ester, or ketone having 1 to about 12 carbon atoms (preferably about 1 to about 4 carbon atoms); $R_{12}$ is OH, Cl, $NR_{17}R_{18}$, aryl or CN, wherein $R_{17}$ and $R_{18}$ are each independently hydrogen or a linear, branched, or cyclic, optionally substituted, alkyl, aryl, alkyne, alkene, ether, ester, or ketone having 1 to about 12 carbon atoms (preferably about 1 to about 4 carbon atoms); and $X=Si(R_3,R_4)-(S-Si(R_5,R_6))_p$ or $(CH_2)_q$, wherein p is an integer from 0 to about 3 and q is an integer from about 1 to 4.

Specific examples of silicon compounds within the scope of the disclosure include 2,2,4-trimethyl-1-thia-2-silacyclopentane, 2,2-dimethoxy-1-thia-2-silacyclopentane, 2,2-diethoxy-1-thia-2-silacyclopentane, bis(trimethylsilyl) sulfide, (mercaptomethyl)methyldiethoxysilane, trimethylsilanethiol, 2,2-methyl-1-thia-2-silacyclopentane, 2,2-dimethoxy-4-methyl-1-thia-2-silacyclopentane, 2,2-diethoxy-4-methyl-1-thia-2-silacyclopentane, silanethiol, triisopropylsilanethiol, trimethoxysilanethiol, triethoxysilanethiol, disilathiane, trimethyl(methylthio)silane, trimethyl(ethylthio)silane, 2,2-dimethyl-1,3-dithia-2-silacyclopentane, 2,2,4,4-tetramethylcyclodisilathiane, 2,2,8,8-tetramethyl-3,7-dithia-2,8-disilanonane, hexamethylcyclotrisilthiane, [(trimethylsilyl)thio]benzene, (3-mercaptopropyl)trimethoxysilane, [[(trimethylsilyl)thio]methyl]benzene, 2-(trimethylsilyl)ethanesulfonyl chloride, 2-(trimethylsilyl)ethanesulfonamide, (3-mercaptopropyl)triethoxysilane, 4-(dimethoxymethylsilyl)-1-butanethiol, 3-(trimethoxysilyl)-1-propanesulfonic acid, [[(trimethylsilyl)methyl]sulfonyl]benzene, bis[3-(triethoxysilyl)propyl] tetrasulfide, 1,1'-thiobis(methylene)bis[1,1,1-trimethylsilane], and 1-(diethoxymethylsilyl)methanethiol whose chemical structures are shown below. Preferred compounds include 2,2,4-trimethyl-1-thia-2-silacyclopentane; 2,2-dimethoxy-1-thia-2-silacyclopentane; and 2,2-diethoxy-1-thia-2-silacyclopentane.

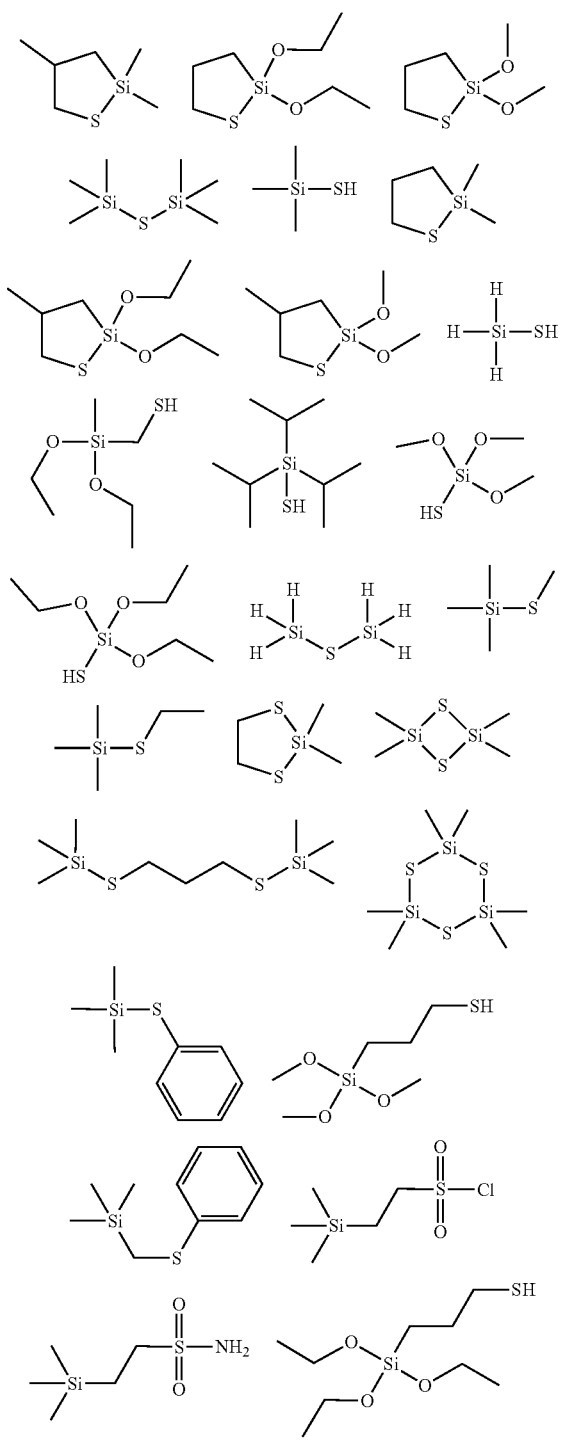

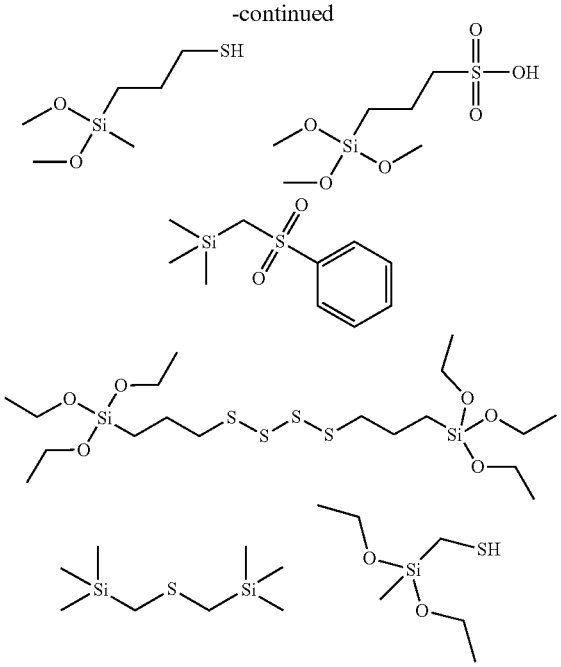

The silicon- and sulfur-containing compounds according to the present disclosure are preferably substantially free of halides, metals, and metal ions. "Substantially free" as used herein in relation to halides, such as for example, chloride, bromide, iodide, or fluoride, means less than about 3 ppm by weight of the halide as determined by inductively coupled plasma mass spectrometry (ICP-MS) or ion chromatography, and more preferably less than about 1 ppm of halide. With respect to metals and metal ions, "substantially free" is used herein to mean less than about 1 ppm of ionic or neutral forms of lithium, sodium, magnesium, potassium, calcium, scandium, titanium, vanadium, chromium, manganese, iron, cobalt, nickel, copper, zinc or other transition metals of higher molecular mass, and more preferably less than about 0.1 ppm of ionic or neutral metals.

In one embodiment, the disclosure specifically relates to a method for selectively depositing a silicon-containing dielectric layer upon at least one existing metallic region of a patterned substrate by employing an atomic layer deposition process, the method comprising:

(a) introducing a patterned substrate into a reaction zone of a deposition chamber, the patterned substrate comprising at least one metallic region and at least one isolated non-metallic region; and heating or cooling the reaction zone to between about 25° C. and about 500° C.;

(b) optionally performing an anneal, clean, etch, or plasma treatment on the patterned substrate;

(c) optionally exposing the patterned substrate to a chemical blocking agent that selectively passivates one or more region of the substrate;

(d) exposing the patterned substrate to a pulse of a compound containing silicon and sulfur;

(e) purging the deposition chamber;

(f) exposing the patterned substrate to an oxidant;

(g) purging the deposition chamber;

(h) repeating steps (d) through (g) until a desired film thickness is reached;

(i) optionally performing an anneal, clean, etch, or plasma treatment on the patterned substrate;

(j) optionally exposing the patterned substrate to a chemical blocking agent to selectively passivate at least one region of the substrate; and (k) optionally repeating steps (d) through (j) until a desired silicon-containing dielectric layer thickness is reached. The silicon-containing dielectric layer overlays only the at least one metallic region of the patterned substrate.

Each of these steps will be described in further detail below. In this method, steps (a) through (c) represent pre-deposition surface preparation, steps (d) through (h) represent an ALD deposition process, and steps (i) through (k) represent a super-cycle ALD process which periodically includes an extra cleaning or modification process in order to enhance selectivity by re-establishing appropriate growth and non-growth surfaces or removing undesired growth on the non-growth surfaces, or to modify the properties of the growing film or its interface with adjacent layers.

Exemplary silicon and sulfur comprising compounds that can be used as precursors according to the present invention have Formula 1, Formula 2, Formula 3, Formula 4, Formula 5, Formula 6, Formula 7, or Formula 8:

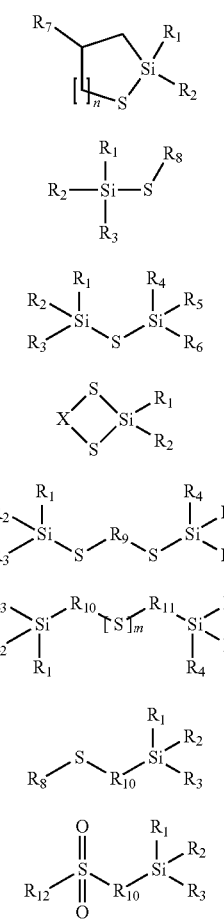

Formula 1

Formula 2

Formula 3

Formula 4

Formula 5

Formula 6

Formula 7

Formula 8

In Formulas 1-8, n is an integer from about 1 to 4, m is an integer from about 1 to 6, $R_1$, $R_2$, $R_3$, $R_4$, $R_5$, $R_6$, and $R_7$ are each independently hydrogen or a linear, branched, or cyclic, optionally substituted, alkoxy, alkyl, aryl, alkyne, alkene, ether, ester, ketone, alkylthio, (alkyl)amino, (dialkyl)amino, alkyl(alkylamino), or alkyl(dialkylamino) group having 1 to about 12 carbon atoms (preferably about 1 to about 4 carbon atoms); or a linear, branched, or cyclic, optionally substituted, silyl group having general formula $SiR_{13}R_{14}R_{15}$, $OSiR_{13}R_{14}R_{15}$, or $R_{16}SiR_{13}R_{14}R_{15}$ wherein $R_{13}$, $R_{14}$, and $R_{15}$ are each independently hydrogen or an alkyl or alkoxy group having about 1 to about 12 carbon atoms (preferably about 1 to about 4 carbon atoms); and $R_{16}$ an linear or branched alkyl group having 1 to about 12 carbon atoms (preferably about 1 to 4 carbon atoms); $R_8$ is hydrogen or a linear, branched, or cyclic, optionally substituted, alkyl, aryl, alkyne, alkene, ether, ester, ketone, alkylthio, (alkyl)amino, (dialkyl)amino, alkyl(alkylamino), or alkyl(dialkylamino) group having 1 to about 12 carbon atoms (preferably about 1 to about 4 carbon atoms); or a linear, branched, or cyclic, optionally substituted, silyl group having general formula $SiR_{13}R_{14}R_{15}$, or $R_{16}SiR_{13}R_{14}R_{15}$; $R_9$, $R_{10}$ and $R_{11}$ are each independently a linear, branched, or cyclic, optionally substituted, alkylene, aryl, alkyne, alkene, ether, ester, or ketone having 1 to about 12 carbon atoms (preferably about 1 to about 4 carbon atoms); $R_{12}$ is OH, Cl, $NR_{17}R_{18}$, aryl or CN, wherein $R_{17}$ and $R_{18}$ are each independently hydrogen or a linear, branched, or cyclic, optionally substituted, alkyl, aryl, alkyne, alkene, ether, ester, or ketone having 1 to about 12 carbon atoms (preferably about 1 to about 4 carbon atoms); and $X=Si(R_3,R_4)-(S-Si(R_5,R_6))_p$ or $(CH_2)_q$, wherein p is an integer from 0 to about 3 and q is an integer from about 1 to 4.

In preferred embodiments, n and m are each 1; $R_1$, $R_2$, $R_3$, $R_4$, $R_5$, and $R_6$ are hydrogen methyl, ethyl, isopropyl, methoxy or ethoxy; $R_7$ is hydrogen or methyl; $R_8$ is hydrogen, methyl, ethyl, or phenyl; $R_9$, $R_{10}$, and $R_{11}$ are each independently an alkylene group having 1 to 4 carbon atoms (—$CH_2$—, —$CH_2$—$CH_2$—, —$CH(CH_3)$—, —$CH_2$—$CH_2$—$CH_2$—, —$CH(CH_3)$—$CH_2$, —$CH_2$—$CH(CH_3)$), —$C(CH_3)_2$—, —$CH_2$—$CH_2$—$CH_2$—$CH_2$—, —$CH_2$—$CH(CH_3)$—$CH_2$, —$CH(CH_3)$—$CH_2$—$CH_2$, —$CH_2$—$CH_2$—$CH(CH_3)$, —$CH(CH_3)$—$CH(CH_3)$—, —$CH_2$—$C(CH_3)_2$ or —$C(CH_3)_2$—$CH_2$), $R_{12}$ is OH, Cl, phenyl, or $NH_2$, and X is $CH_2CH_2$, $Si(CH_3)_2$, or $Si(CH_3)_2$—S—$Si(CH_3)_2$.

A method according to the disclosure involves introducing a patterned substrate into a reaction zone of a deposition chamber, the patterned substrate comprising at least one metallic region and at least one isolated non-metallic region; having metallic and non-metallic regions into a reaction zone of a deposition chamber, heating or cooling the reaction zone to about 25° C. to about 500° C.; and exposing the patterned substrate to the following sequence of steps which are repeated as many times as necessary to achieve the desired film thickness: exposing the patterned substrate to a pulse of a compound containing silicon and sulfur (preferably a compound having one of Formulas 1-8), purging the deposition chamber, exposing the patterned substrate to an oxidant, and purging the deposition chamber. The resulting silicon-based dielectric layer selectively forms upon metallic regions or areas of the patterned substrate so that is overlays only the metallic region(s) of the patterned substrate. For the purposes of this disclosure, the terms "layer" and "film" may be understood to be synonymous. For the purposes of this disclosure, references to "a compound having Formula 1-8" may be understood to encompass any compound containing silicon and sulfur, such as compounds having at least one silicon-sulfur bond, and in particular a compound having at least one of Formula 1 to Formula 8.

Appropriate non-metallic substrate regions include, without limitation, the presently preferred silicon dioxide, silicon oxycarbide, silicon oxynitride, silicon carboxynitride, silicon oxyfluoride, silicon nitride, silicon carbon nitride, silicon carbide, borosilicate, carbon or alumina. Other possible substrates which would be appropriate include, without limitation, substrates containing non-metallic regions comprising silicon, germanium, silicon-germanium alloy, titanium nitride, tantalum nitride, aluminum oxide, hafnium dioxide, titanium dioxide, and/or zinc oxide. Appropriate metallic substrates regions include the presently preferred copper, cobalt and ruthenium as well as, without limitation, tungsten, gold, and/or molybdenum.

The term "patterned substrate" should be understood to refer to a substrate with at least two isolated or separated regions of differing materials. In some aspects of this invention, the two or more materials are exposed at the substrate surface. In other aspects of the invention, the two or more materials are "buried" under one or more materials to thicknesses of up to ten nanometers, that is, the substrate contains at least two layers: a first layer comprising at least two isolated or separated regions (metallic and non-metallic) and a second layer comprising a buffer material and having a thickness of less than about 10 nm. A variety of different types of patterned substrates are appropriate for use in the method described herein, provided that they contain both non-metallic and either exposed or buried metallic regions. The term "substrate" as used herein is used to describe the material surface on which film processing is performed during the manufacturing process. For example, a substrate may comprise a bulk layer of silicon, silicon dioxide, silicon-on-insulator, strained silicon, doped silicon, germanium, gallium arsenide, silicon carbide, glass, alumina, metals or metal nitrides depending on the application. In addition to the bulk layer, the substrate may contain multiple layers of patterned thin films that form a device. Additionally, the substrate may be substantially planar, or comprise three-dimensional structures such as lines, trenches, pillars, or vias. The exposed surfaces of the outermost layers comprise the substrate, which must include at least one exposed or buried metallic growth region and at least one non-metallic non-growth region according to the present disclosure.

Figure 1B:
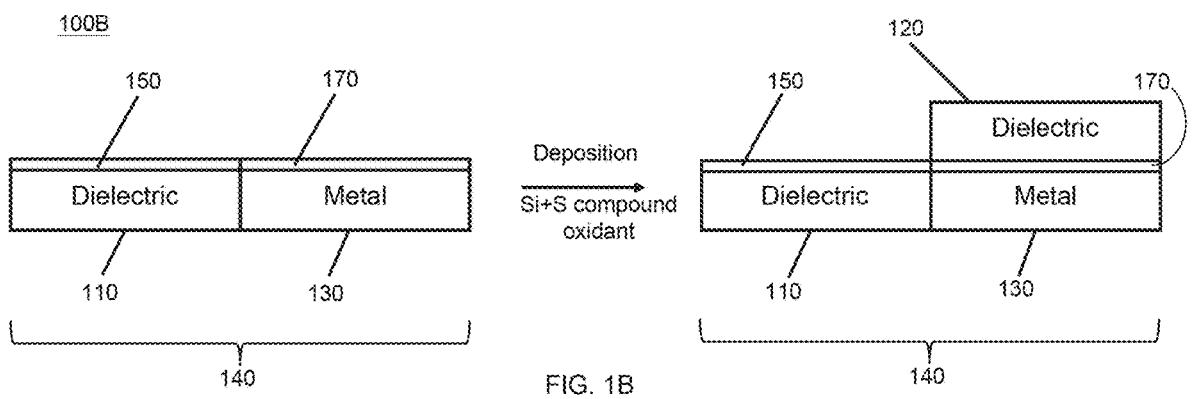
FIG. 1B is a schematic of the process according to a second embodiment of the disclosure.

These embodiments are illustrated by the schematics in FIGS. 1 and 2. FIG. 1A depicts method 100A for deposition of a silicon-containing dielectric on a patterned substrate 140 which contains at least one non-metallic (dielectric) region 110 and at least one isolated metallic region 130. A deposition step which involves exposure of the patterned substrate to a compound comprising silicon and sulfur and to an oxidant results in the selective formation of a silicon-containing dielectric layer 120 overlaying only the metallic region 130 of the substrate 140. FIG. 1B depicts process 100B for deposition of a silicon-containing dielectric on a patterned substrate 140 which contains at least one non-metallic (dielectric) region 110 and at least one isolated metallic region 130, as well as a native oxide layer 150 on the dielectric region and a native oxide layer 170 on the metallic region. A deposition step which involves exposure of the patterned substrate to a compound comprising silicon and sulfur and to an oxidant results in the selective formation of a silicon-containing dielectric layer 120 on the native oxide layer 170 overlaying only the metallic region 130 of the substrate 140. While not shown, it is also possible for only one of the metallic and non-metallic regions to have a native oxide layer.

Figure 2A:
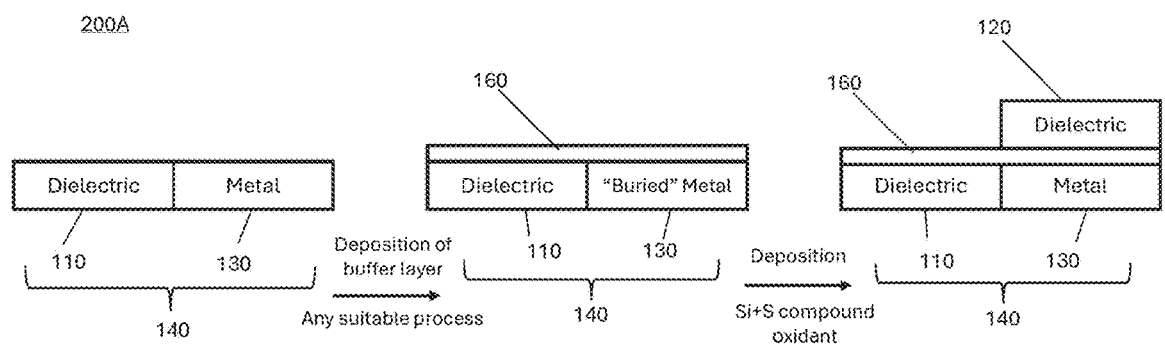
FIG. 2A is a schematic of the process according to a third embodiment of the disclosure.
Figure 2B:
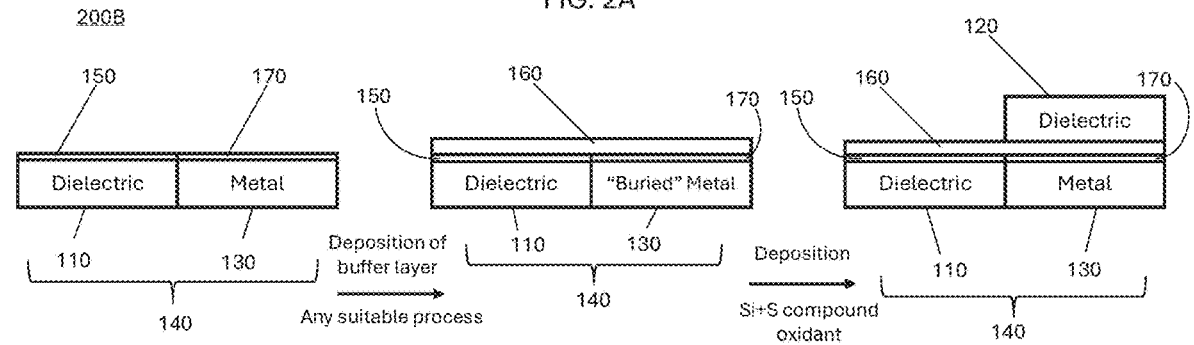
FIG. 2B is a schematic of the process according to a fourth embodiment of the disclosure.

FIG. 2A depicts method 200A for deposition of a silicon-containing dielectric on a patterned substrate 140 which contains at least one non-metallic (dielectric region) 110 and at least one isolated metallic region 130. A first deposition step results in the formation of a buffer layer 160 on the substrate 140 containing the non-metallic (dielectric) region 110 and the metallic region 130, which may now be referred to as a "buried" metal region. A deposition step which involves exposure to a compound comprising silicon and sulfur and to an oxidant results in the selective formation of a silicon-containing dielectric layer 120 on the buffer layer 160 overlaying only the metallic region 130 of the substrate 140. FIG. 2B depicts process 200B for deposition of a silicon-containing dielectric on a patterned substrate 140 which contains at least one non-metallic (dielectric) region 110 and at least one isolated metallic region 130, as well as a native oxide layer 150 on the dielectric region and a native oxide layer 170 on the metallic region. A first deposition step results in the formation of a buffer layer 160 on the substrate 140 containing the non-metallic (dielectric) region 110, the metallic region 130, which may now be referred to as a "buried" metal region, and the native oxide layers. A deposition step which involves exposure to a compound comprising silicon and sulfur and to an oxidant results in the selective formation of a silicon-containing dielectric layer 120 on the buffer layer 160 overlaying only the metallic region 130 of the substrate 140. While not shown, it is also possible for only one of the metallic and non-metallic regions to have a native oxide layer.

In some aspects of the disclosure, the metallic growth regions of the patterned substrate are exposed at the substrate surface. The inventive growth process for silicon-containing films begins directly at the interface of the metallic region, which may include an oxide of the metal, and the deposited silicon-containing film.

Additional aspects this disclosure may utilize patterned substrates where the metallic growth regions are buried and not at the exposed surface of the substrate. That is (as shown in FIGS. 2A and 2B), the substrate contains at least two layers: a first layer comprising at least two isolated or separated regions (metallic and non-metallic) and a second layer comprising a buffer material and having a thickness of less than about ten nm, or less than about five nm (including all intermediate values and ranges) in alternative embodiments; the buffer layer may be as thin as about 2 Angstroms, so that the buffer layer thickness may be about 2 Angstroms to about ten nm, including all intermediate thicknesses. As a non-limiting example, a patterned substrate with exposed metallic and non-metallic regions at the substrate surface may be coated with up to ten nanometers of a buffer layer (buffer material) comprising a semiconductor, oxide, nitride, or mixture thereof by atomic layer deposition, chemical vapor deposition, epitaxial deposition, physical vapor deposition, or other means known in the art, forming a buried metallic region. Preferred buffer materials include, without limitation, silicon, germanium, aluminum oxide, silicon dioxide, silicon oxycarbide, silicon nitride, silicon oxynitride, silicon carboxynitride, tantalum nitride, titanium nitride, copper oxide, cobalt oxide, ruthenium oxide, molybdenum oxide, and tungsten oxide. Areas of the substrate surface within about ten nanometers, or preferably about six nanometers, more preferably about five nanometers, or even more preferably about four nanometers or less (including all intermediate values and ranges) of buried metallic regions should be understood to be growth regions, while areas of the substrate surface outside these distances from a buried metallic region shall be understood to be non-growth regions.

In aspects of the invention where the metallic growth regions are buried, it should be understood that in planar substrates, the growth surface will be centered above the buried metallic region. In other words, the silicon-containing dielectric layer forms upon the buffer layer on the patterned substrate and overlays only the metallic region(s); it does not cover (does not overlay and is not positioned upon) the non-metallic regions. In aspects of the invention involving three-dimensional substrates, the growth surface may be centered beside, under, around, or otherwise proximate to the buried metal region.

In the initial step, the reaction zone of the deposition chamber is heated or cooled to between about 25° C. and about 500° C., inclusive, so that all temperatures within this range are included. Preferred temperatures for the reaction zone are between about 75° C. and about 300° C., including all temperatures within this range, such as about 100° C., about 125° C., about 150° C., about 175° C., about 200° C., about 225° C., about 250° C., and about 275° C., including all intervening temperatures.

The parameters of the purge cycles are not particularly limited, and may be optimized based on the specific reaction conditions, apparatus, and reactants. Generally, any inert gas such as argon or nitrogen may be employed; typical purge cycles are at least about 2 seconds long. In preferred embodiments, the purges are about 5 to about 15 seconds.

The temperatures of the substrate and the reaction zone of the deposition chamber are critical for producing the desired silicon-based dielectric layer on the patterned substrate. Specifically, the temperatures of the substrate and of the reaction zone in the deposition chamber during exposure to the pulses of the compound having Formula 1-8, as described below, are preferably about 25° C. to about 500° C., more preferably about 75° C. to about 300° C. It may be understood that the ranges of substrate temperatures are inclusive of all temperatures within the range, so that temperatures of about 75° C. to about 300° C. include temperatures such as about 100° C., about 125° C., about 150° C., about 175° C., about 200° C., about 225° C., about 250° C., about 275° C., and all intervening temperatures.

It is within the scope of the disclosure for the temperatures of the substrate and the reaction zone of the deposition chamber to be the same or different. That is, it is possible to heat or cool the substrate chuck or platen independently of the chamber, and these temperatures may be independently controlled by the deposition tool. It is possible to raise the substrate temperature even higher than the main part of the chamber, however, these gaps are typically minor (about 10° C. to about 30° C.). Therefore, the ranges described above are applicable to both the substrate and the reaction zone. It is understood in the art that in ALD, these are effectively the same, as the reactions occur on the substrate surface. In CVD, however, reactions take place both in the gas phase in the main chamber space and on the substrate surface. In that case, a temperature differential between the reaction zone and substrate can be introduced.

The pulse lengths of each reactant may also be optimized based on the specific reaction conditions and apparatus and are generally kept as short as practical. The pulse length for the compound having Formula 1-8 is about 0.05 to about 30 seconds, preferably 1 to about 15 seconds, more preferably about 3 seconds to about 10 seconds, more preferably at least 2 seconds, even more preferably about 3 seconds, and even more preferably about 5 seconds. While longer pulse times may be effective for all compounds, they are not practical from a materials consumption or tool utilization standpoint.

Optionally, prior to exposing the substrate to the compound having Formula 1-8, it is within the scope of the disclosure to perform an annealing, cleaning, etching, or plasma treatment of the patterned substrate. For example, the substrate may be washed with ethanol for about five minutes before being placed into the deposition chamber at the desired deposition temperature and then treated with about one minute of nitrogen plasma via remote ICP for 60 seconds at a power of 2500 W before initiation of the deposition process. While not limiting, other examples of wet pre-treatment protocols that may be appropriate, depending on the nature of the growth and non-growth surfaces of the patterned substrate, include washes or etches with organic solvents such as isopropanol or tetrahydrofuran, organic acids such as citric acid or acetic acid, mineral acids such as hydrogen fluoride, hydrogen chloride, or sulfuric acid, bases such as ammonia, or oxidizers such as hydrogen peroxide, alone, as mixtures, or in sequential combination, as is known in the art. Dry processes that may be used as pre-treatments include annealing steps in the same or different chamber which may comprise either reducing or oxidizing conditions, reactive ion etch, or plasma treatment. It may be understood that more than one pre-treatment may be applied to the same patterned substrate as appropriate for the specific regions of the patterned substrate. Other similar substrate pre-treatment processes which are known in the art would also be applicable. Such treatments may improve the selectivity of the inventive process or performance of the resulting films, but the appropriate pretreatment method and conditions may be determined on a case-to-case basis depending on the specific substrate, apparatus, reactants, and reaction conditions.

Optionally, prior to exposing the patterned substrate to a pulse of a compound having Formula 1-8, the patterned substrate is exposed to a chemical blocking agent that selectively passivates one or more non-growth regions of the substrate. If such an optional step is performed, the chemical blocking agent may be removed once the desired dielectric film thickness has been achieved. Inhibitor compounds that may be used include, without limitation, chlorosilanes, alkoxysilanes, aminosilanes, cyclic azasilanes, alkane thiols, alkane phosphoric acids, phenols, organic acids, alkynes, alkenes, aldehydes and ketones, which may be removed by dry processes not limited to plasma etching, reactive ion etching, corona treatment, ozonolysis, UV/ozone, thermal decomposition or thermal desorption, or wet etching processes utilizing formulations comprising organic solvents, acid, base, or hydrogen peroxide.

For the purposes of this disclosure, "oxidant" may refer to oxygen, hydrogen peroxide, ozone, or an oxidizing plasma. The phrase "oxidizing plasma" may be understood to mean a plasma generated using a gas mixture containing at least one of $O_2$, $H_2O$, $H_2O_2$, $O_3$, $CO_2$, $N_2O$, or $NO_2$, and optionally a carrier gas comprising $N_2$, Ar or He. In preferred embodiments, the plasma comprises oxygen plasma delivered by a remote inductively-coupled plasma (ICP) system. However, it is within the scope of the disclosure to use other forms of plasma generation such as capacitively coupled plasma or hollow cathode plasma.

Exposure of the patterned substrate to the oxidant may occur either sequentially or simultaneously with respect to the exposure to the silicon-containing compound of Formula 1-8. In the case of alternating exposure of silicon compound and oxidant, generally referred to atomic layer deposition (ALD), the duration of the oxidant exposure is preferably about 0.5 seconds to about 60 seconds and most preferably about 5 to 20 seconds. Additional or extended pulses of oxidant may be added before the deposition process to clean or otherwise prepare the surface, or added after the deposition process to clean or otherwise prepare the surface for subsequent processes in the manufacture of the desired semiconductor device. Within the scope of this disclosure, it may be understood that the term "pulse" includes both temporal and spatial methods of exposing the patterned substrate to the chemical compound of Formula 1-8 and the oxidant in a sequential manner. While not limiting, examples of appropriate methods of pulsing the inventive chemical compounds of Formula 1-8 include open vacuum systems in which the precursor container, reaction chamber, and pumping system are connected throughout the pulse, closed vacuum systems in which the pumping system is isolated from the reaction chamber during part or all of the pulse, inducing a dwell time for the chemical precursor in the reaction chamber, or systems which create exposures to the chemical compounds of Formula 1-8 by physically moving the patterned substrate from regions of space where the chemical compounds are present to areas where they are not, commonly referred to as "Spatial ALD." It should also be understood that pulses of the oxidant may be implemented by either temporal or spatial methods.

In the case of simultaneous exposure of the substrate to precursor and oxidant, generally referred to as chemical vapor deposition (CVD), the duration of the process is determined by the growth rate of the process under the specific conditions being utilized and the desired thickness of the deposited film. It may be understood that it is within the scope of the disclosure that the CVD process involves both cases in which the oxidant and precursor introduction start and end simultaneously, and cases in which either one starts before or ends after the other. Additionally, the CVD process within the scope of the disclosure may consist of a single exposure to precursor and oxidant, or a series of shorter exposures divided by purges of the reaction zone by inert gases or cleans, etches, anneals or additional plasma treatments of the patterned substrate, referred to as "Pulsed CVD."

In some aspects of this disclosure, the oxidant is a plasma generated using a gas mixture containing at least one of $O_2$, $H_2O$, $H_2O_2$, $O_3$, $CO_2$, $N_2O$, or $NO_2$ and optionally a carrier gas comprising $N_2$, Ar or He. In the case of a plasma as oxidant, the inventive processes may be considered a plasma-enhanced atomic layer deposition process (PEALD) or plasma-enhanced chemical vapor deposition process (PECVD).

The duration of the oxidant exposure is preferably about 1 to about 300 seconds per nanometer of film growth, more preferably about 5 to about 100 seconds. It is well understood in the art that the "per nanometer of film growth" is important in a CVD process, because unlike ALD, in which film thickness is controlled by the number of repeated cycles, in CVD the thickness is controlled by time. CVD is generally a linear process, so the thickness of a film may be about doubled by doubling the length of the process.

In some embodiments, after a number of Formula 1-8 compound exposure/purge/oxidant exposure/purge sequences (such as about 1 to about 50 sequences) have been completed, the substate is subjected to an annealing, cleaning, etching, or plasma treatment as previously described, as well as an optional exposure to a chemical blocking agent as previously described.

It is within the scope of the disclosure to prepare silicon-containing dielectric films having thicknesses of about 2 to 20 nm, particularly about 3 nm to 10 nm, which thicknesses are currently desirable in the microelectronic industry. The desired film or layer thickness may be achieved by following the method steps described herein repeatedly.

The silicon-containing dielectric films produced by the methods described herein may have dielectric constants of less than about 10, ore less than about 5 in some embodiments.

It is further within the scope of the disclosure to move the chemical compounds of Formula 1-8 in a carrier gas. Without limitation, any noble gas, such as argon, or inert gas, such as nitrogen, would be appropriate. However, it is also within the scope of the disclosure not to employ a carrier gas.

In a further aspect of the disclosure, a method for selectively depositing a dielectric layer upon an existing metallic layer of a patterned substrate by employing a chemical vapor deposition (CVD) process or pulsed chemical vapor deposition process comprises:

(a) introducing a patterned substrate into a reaction zone of a deposition chamber, the patterned substrate comprising at least one metallic region and at least one isolated non-metallic region; and heating or cooling the reaction zone to between about 25° C. and about 500° C.;

(b) optionally performing an anneal, clean, etch, or plasma treatment on the substrate;

(c) optionally exposing the patterned substrate to a chemical blocking agent to selectively passivate at least one region of the substrate;

(d) exposing the patterned substrate to a compound of Formula 1-8 while simultaneously exposing the patterned substrate to an oxidant;

(e) optionally purging the deposition chamber;

(f) repeating steps (d) through (e) until a desired film thickness is reached;

(g) optionally performing an anneal, clean, etch, or plasma treatment on the patterned substrate;

(h) optionally exposing the patterned substrate to a chemical blocking agent to selectively passivate at least one region of the substrate; and (i) optionally repeating step (d) through step (h) until a desired silicon-containing dielectric layer thickness is reached. The silicon-containing dielectric layer overlays only the at least one metallic region of the patterned substrate.

The compounds having Formulas 1-8 have been described previously, as have the properties of the resulting silicon-containing dielectric film.

Most of the steps of this method have been described previously with the exception of step (d), which involves exposure to the Formula 1-8 compound and the oxidant described previously. This simultaneous exposure to the chemical compound of Formula 1-8 and oxidant may be continued without interruption until the desired film thickness is reached, or stopped and restarted multiple times in order to include cleans, anneals, etches or plasma treatments of the patterned substrate with film deposited thereon within the process of growing the target film. While the exposure to the compound of Formula 1-8 and the oxidant are simultaneous, it should be understood that within the scope of this disclosure either exposure may start before or end after the other.

In this method, steps (a) through (c) represent pre-deposition surface preparation, steps (d) through (f) represent a CVD deposition process, and steps (g) through (i) represent a super-cycle CVD or pulsed CVD process which periodically includes an extra surface cleaning or modification process in order to enhance selectivity by re-establishing appropriate growth and non-growth surfaces or removing undesired growth on the non-growth surfaces, or annealing processes that modify the surface or bulk properties of the deposited film.

In some embodiments, the silicon- and sulfur-containing compounds may be used in an ALD or CVD process to form a dielectric layer on an exposed metallic region or above, beside, or proximate to a "buried" metallic region of a patterned substrate in an inherently selective manner as previously described. The term "selectively" as used herein means that the deposited film forms on the target growth surface at a rate greater than or equal to at least five times, preferably ten times, or even more preferably twenty or more times, than it deposits on untargeted non-growth surfaces. As used herein, an "inherently" selective process is a process in which no modification of at least one non-growth metal surface by organic molecules or polymer films is required to suppress growth on the non-growth surfaces during the deposition process.

However, it is within the scope of the disclosure to employ organic molecules or polymer films known in the art to further enhance the selectivity of the process by suppressing growth on one or more non-growth surfaces. Such molecules known in the art include, without limitation, $C_1$-$C_{18}$ thiols such as dodecanethiol, $C_1$-$C_{18}$ silanes such as dodecylsilane, ketones such as acetylacetone, phenols such as catechol, $C_1$-$C_{18}$ phosphonic acids such as octadecylphosphonic acid, amines such as aniline, cyclic azasilanes such as N-methyl-aza-2,2,4-trimethylsilacyclopentane, chlorosilanes such as trichloro(octadecyl)silane, aminosilanes such as (dimethylamino)(dimethyl) octadecylsilane or dimethylaminotrimethylsilane, alkoxysilanes such as triethoxy(octadecyl)silane, benzimidazolium N-heterocyclic carbenes, or imidazolium N-heterocyclic carbenes. These exemplary organic molecules may form self-assembled monolayers (SAMs) or cover the non-growth area in a manner with little molecular alignment (small molecule inhibition, or SMI). Example polymeric films may either be pre-formed polymers that are selectively deposited or cast on non-growth areas or polymer films that are grown in-situ selectively on non-growth areas. The small molecule, SAM, or polymeric blocking agent may be applied before the ALD or CVD process is initiated or one or more times during the middle of the ALD or CVD process, or both, in order to achieve optimize selectivity with respect to all growth and non-growth surfaces found on the substrate.

As used herein, the terms "growth" and "non-growth" shall be understood to refer to areas of a patterned substrate where dielectric film growth is desired and not desired, respectively, for the fabrication of a device structure. According to the present disclosure, at least one growth region must be a metal. Non-limiting examples of exemplary metals that may be a growth region include copper, cobalt, ruthenium, molybdenum, tungsten, gold, and their bulk or native surface oxides. Non-limiting examples of non-growth region include silicon dioxide, silicon, silicon-germanium, alumina, germanium, SiOC low-k dielectrics, silicon nitride, tantalum nitride, titanium nitride, silicon carbide and their native oxides. It should be understood that the non-limiting examples of both growth and non-growth regions, as shown in FIGS. 1B and 2B and described above, for example, includes both regions including any native oxide layer, and surfaces which do not have native oxide layers or surfaces stripped of native oxide layers by means known in the art such as chemical mechanical polishing, wet etching, plasma etching, or reactive ion etching.

The terms "atomic layer deposition" or "ALD" may be understood to mean a temporal process by which a silicon and sulfur-comprising precursor is introduced to a reaction chamber containing the substrate for a set period of time, the reaction chamber purged with an inert gas such as nitrogen, argon or helium, the substrate is exposed a second reactant or plasma for a set period of time, and the reaction chamber again purged with an inert gas. This cycle of four steps is then repeated until the desired film thickness is reached. Alternatively, "atomic layer deposition" or "ALD" may be understood to mean a spatial process, in which the substrate is alternatively moved between a location containing the silicon and sulfur-comprising precursor and a location containing the second reactant or plasma, a process that is repeated until the desired film thickness is achieved. While the ALD process described herein has four steps, it should be understood that it is within the scope of the invention to add additional steps.

The terms "chemical vapor deposition" or "CVD" may be understood to mean a process by which a silicon and sulfur-comprising precursor is introduced to a reaction chamber simultaneously with a second reactant or plasma, and exposure is continued until a desired film thickness is reached.

According to the present disclosure, both ALD and CVD processes may be understood to mean that the substrate may be exposed to one or more pretreatment processes in the same or different tool before initiation of the ALD or CVD process. These pretreatment processes may include wet or plasma etch, polish, solvent wash, hydroxylation, oxidation, reduction, anneal, or UV or e-beam exposure. It may also be understood that the pretreatment processes may optionally include the use of blocking agents such as a small molecule inhibitor, self-assembled monolayer, or polymeric film in order to suppress growth on one or more non-growth surfaces.

The ALD and CVD processes as described herein may be performed once or more than once. If the ALD or CVD process is performed more than once, processes including wet or plasma etch, polish, solvent wash, hydroxylation, oxidation, reduction, anneal, and/or UV or e-beam exposure may be performed between ALD and CVD processes. Furthermore, processes including wet or plasma etch, polish, solvent wash, hydroxylation, oxidation, reduction, anneal, and UV or e-beam exposure may be implemented after the final ALD or CVD process in order to remove undesired film growth on non-growth surfaces, to remove particles or contaminants, to chemically or physically transform the deposited materials, or to prepare the substrate surface for further device fabrication steps.

The invention will now be described in connection with the following, non-limiting examples.

Example 1: Deposition of Silicon Dioxide Layer on a Copper Substrate

A silicon wafer with 500 nm of physically vapor deposited (PVD) copper was washed with ethanol for five minutes and then placed in a reaction chamber at 150° C. The wafer was exposed to one minute of nitrogen plasma, and then 100 ALD cycles of sequential exposures to 2,2,4-trimethyl-1-thia-2-silacyclopentane (5 seconds) and oxygen plasma (10 seconds), separated by 15 second and 10 second purges, respectively. Growth of a film of approximately 8 nanometers of thickness was observed by in-situ ellipsometry (FIG. 3) and was determined to be comprised of silicon dioxide (FIG. 4) by XPS. FIG. 4 and FIGS. 5-11 described below include both measured data and data simulated for multi-layer film stacks with an effective X-Ray penetration depth of ten nanometers.

Example 2: Deposition of a Silicon Dioxide Layer on a Cobalt Substrate

Figure 5:
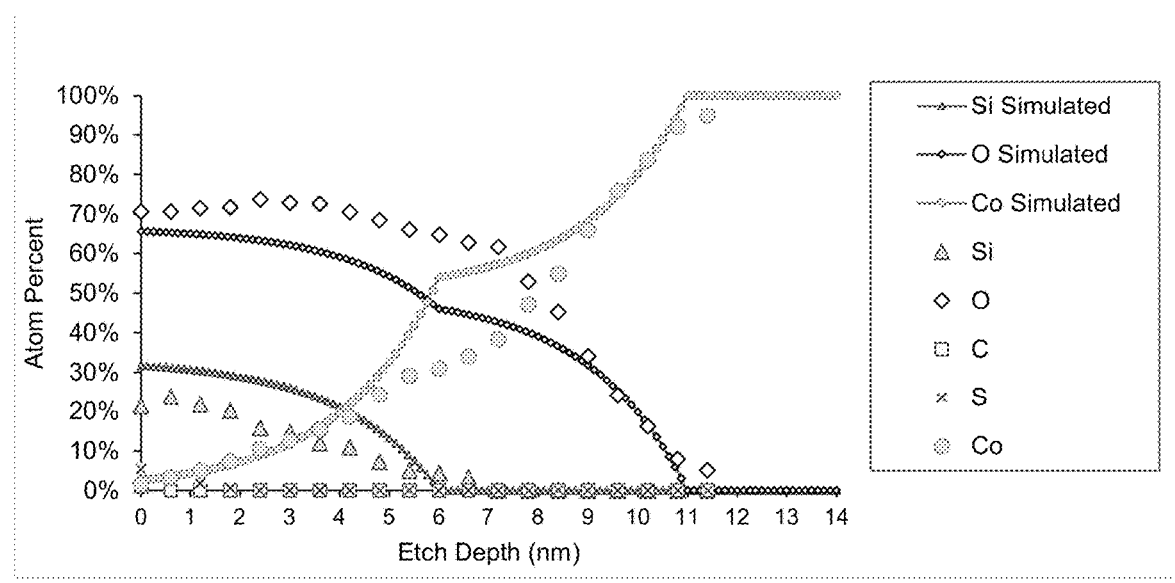
FIG. 5 depicts XPS depth profile data for the film prepared on a cobalt substrate as described in Example 2.

A silicon wafer with 50 nm of physically vapor deposited (PVD) cobalt was placed in a reaction chamber at 150° C. The wafer was exposed to one minute of nitrogen plasma, and then 100 ALD cycles of sequential exposures to 2,2,4-trimethyl-1-thia-2-silacyclopentane (5 seconds) and oxygen plasma (10 seconds), separated by 15 second and 10 second purges, respectively. Growth of a silicon dioxide film of similar thickness to Example 1 was observed by XPS (FIG. 5).

Figure 3:
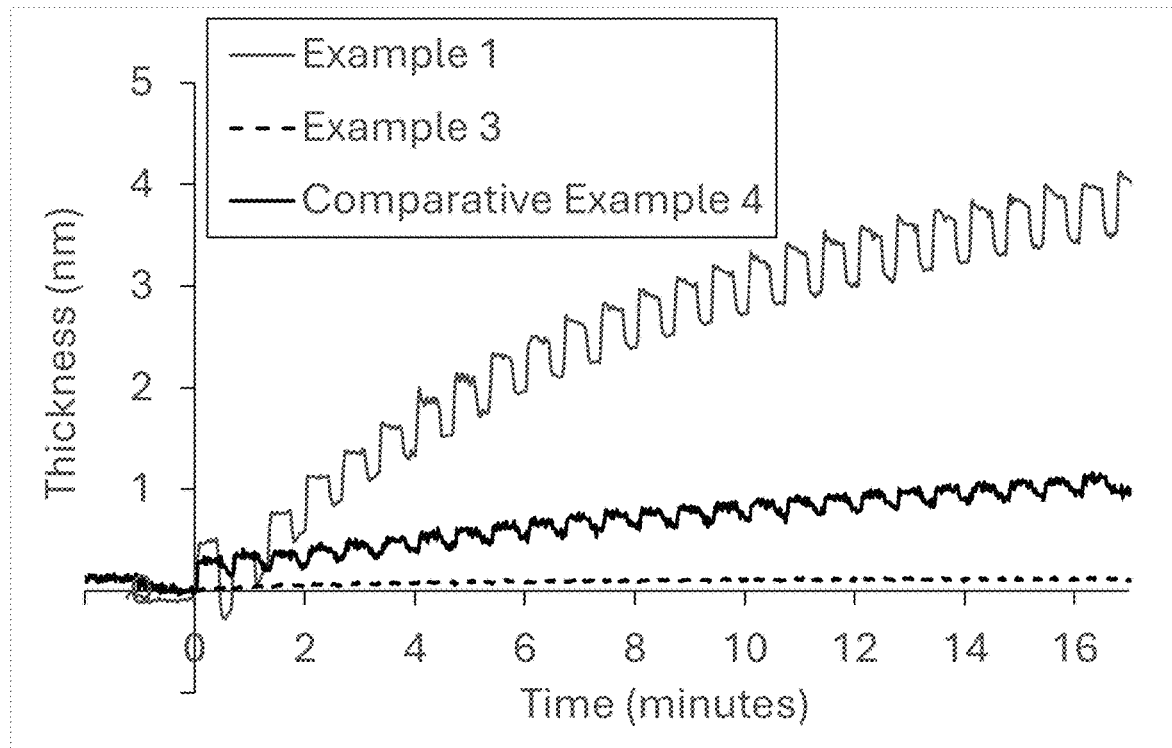
FIG. 3 shows in-situ ellipsometry graphs for the films prepared in Example 1 and Example 3, and Example 4 (Comparative)

Example 3: Selective Non-Deposition of Silicon Dioxide on a Silicon Dioxide Substrate A silicon wafer with 1000 nm of thermally-grown silicon dioxide was placed in a reaction chamber at 150° C. The wafer was exposed to one minute of nitrogen plasma, and then 25 ALD cycles of sequential exposures to 2,2,4-trimethyl-1-thia-2-silacyclopentane (5 seconds) and oxygen plasma (10 seconds), separated by 15 second and 10 second purges, respectively. Film growth of <0.1 nm was observed by in-situ ellipsometry (FIG. 3).

Example 4 (Comparative): Non-Selective Deposition Using a Comparative Compound A silicon wafer with 1000 nm of thermally-grown silicon dioxide was placed in a reaction chamber at 150° C. The wafer was exposed to one minute of nitrogen plasma, and then 25 ALD cycles of sequential exposures to N-methyl-aza-2,2,4-trimethylsilacyclopentane (5 seconds) and oxygen plasma (10 seconds), separated by 15 second and 10 second purges, respectively. Film growth of 0.04 nm per cycle was observed by in-situ ellipsometry (FIG. 3).

Example 5: Deposition of Silicon Dioxide Layer on a Cobalt Substrate

A silicon wafer with 50 nm of physically vapor deposited (PVD) cobalt was placed in a reaction chamber at 175° C. The wafer was exposed to one minute of nitrogen plasma, and then 150 ALD cycles of sequential exposures to (mercaptomethyl)methyldiethoxysilane (5 seconds) and oxygen plasma (10 seconds), separated by 15 second and 5 second purges, respectively. Growth of a film of approximately 11 nanometers of thickness was observed and was determined to be comprised of silicon dioxide (FIG. 6) by XPS.

Example 6: Deposition of Silicon Dioxide Layer on a Ruthenium Substrate

A silicon wafer with 100 nm of physically vapor deposited (PVD) ruthenium was placed in a reaction chamber at 175° C. The wafer was exposed to one minute of nitrogen plasma, and then 150 ALD cycles of sequential exposures to (mercaptomethyl)methyldiethoxysilane (5 seconds) and oxygen plasma (10 seconds), separated by 15 second and 5 second purges, respectively. Growth of a film of approximately 6 nanometers of thickness was observed and was determined to be comprised of silicon dioxide (FIG. 7) by XPS.

Example 7: Deposition of Silicon Dioxide Layer on a Buried Copper Substrate

A silicon wafer with 500 nm of physically vapor deposited (PVD) copper was coated with 3 nanometers of silicon dioxide by a non-selective thermal atomic layer deposition process. This buried copper substrate was then placed in a reaction chamber at 150° C. The wafer was exposed to one minute of nitrogen plasma, and then 150 ALD cycles of sequential exposures to 2,2,4-trimethyl-1-thia-2-silacyclopentane (5 seconds) and oxygen plasma (10 seconds), separated by 15 second and 10 second purges, respectively. Growth of a film of approximately 12 nanometers of thickness was observed and was determined to be comprised of silicon dioxide (FIG. 8) by XPS. The total silicon dioxide thickness was approximately 15 nanometers.

Example 8: Non-Deposition of Silicon Dioxide Layer on a Buried Native Oxide Silicon Substrate A silicon wafer with a native oxide layer of approximately 2 nm of thickness was coated with an additional 3 nanometers of silicon dioxide by the same non-selective thermal atomic layer deposition process described in Example 7. This buried native oxide substrate was then placed in a reaction chamber at 150° C. The wafer was exposed to one minute of nitrogen plasma, and then 150 ALD cycles of sequential exposures to 2,2,4-trimethyl-1-thia-2-silacyclopentane (5 seconds) and oxygen plasma (10 seconds), separated by 15 second and 10 second purges, respectively. Less than 1 nm of film growth was observed by ellipsometry and the substrate was determined to be comprised of approximately 5.5 nanometers of silicon dioxide on silicon (FIG. 9) by XPS.

Example 9: Deposition of Silicon Dioxide Layer on a Buried Copper Substrate

A silicon wafer with 500 nm of physically vapor deposited (PVD) copper was coated with 3 nanometers of silicon oxynitride by a non-selective plasma atomic layer deposition process. This buried copper substrate was then placed in a reaction chamber at 150° C. The wafer was exposed to one minute of nitrogen plasma, and then 50 ALD cycles of sequential exposures to 2,2,4-trimethyl-1-thia-2-silacyclopentane (5 seconds) and oxygen plasma (10 seconds), separated by 15 second and 10 second purges, respectively. Growth of a film of approximately 4.5 nanometers of thickness was observed and was determined to be comprised of silicon dioxide (FIG. 10) by XPS. The total thickness of silicon dioxide and silicon oxynitride was approximately 7.5 nanometers.

Figure 11:
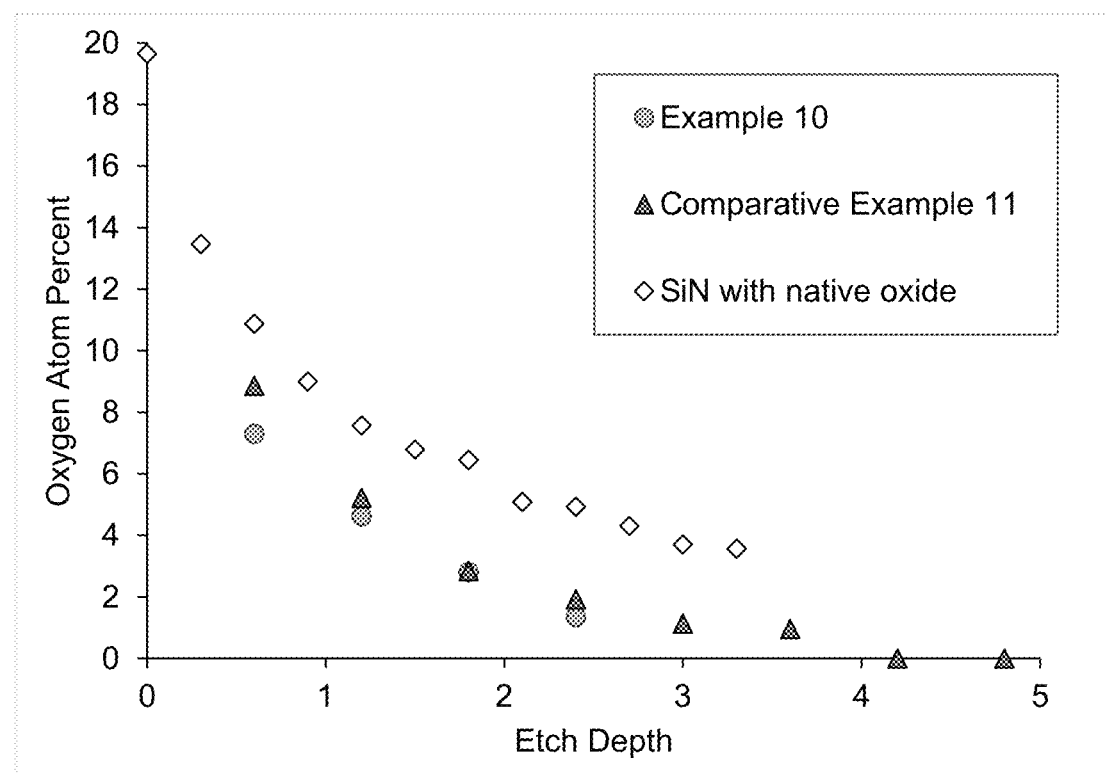
FIG. 11 depicts XPS data for the non-deposition of a silicon dioxide layer on a silicon nitride substrate as described in Example 10 and Comparative Example 11.

Example 10: Selective Non-Deposition of Silicon Dioxide on a Silicon Nitride Substrate A silicon wafer with 100 nm of thermally-grown silicon nitride was placed in a reaction chamber at 175° C. The wafer was exposed to one minute of nitrogen plasma, and then 150 ALD cycles of sequential exposures to 2,2,4-trimethyl-1-thia-2-silacyclopentane (5 seconds) and oxygen plasma (10 seconds), separated by 15 second and 10 second purges, respectively. No silicon dioxide film growth was observed relative to the native oxide layer of silicon nitride substrate that had not undergone the deposition process (FIG. 11).

Example 11 (Comparative): Non-Inventive Process without Precursor

A silicon wafer with 100 nm of thermally-grown silicon nitride was placed in a reaction chamber at 175° C. The wafer was exposed to one minute of nitrogen plasma, and then 150 ALD cycles of sequential exposures to oxygen plasma (10 seconds), separated by 25 second No silicon dioxide film growth was observed relative to the native oxide layer of silicon nitride substrate that had not undergone the deposition process, or Example 10 (see FIG. 11).

FIG. 3 shows in-situ ellipsometry for Example 1, Example 3, and Comparative Example 4, demonstrating cyclic ALD growth for Example 1 on a copper substrate but no growth on a silicon dioxide substrate (Example 3) under identical conditions. Comparative Example 4 demonstrates that a compound similar to that used in Examples 1, 2, and 3 but which does not contain both silicon and sulfur resulted in deposition of silicon dioxide on a silicon dioxide substrate. These examples therefore demonstrate the selectively for metallic versus non-metallic regions when employing the claimed precursor compounds and the criticality of the claimed compounds for the non-growth on non-metallic regions.

Figure 4:
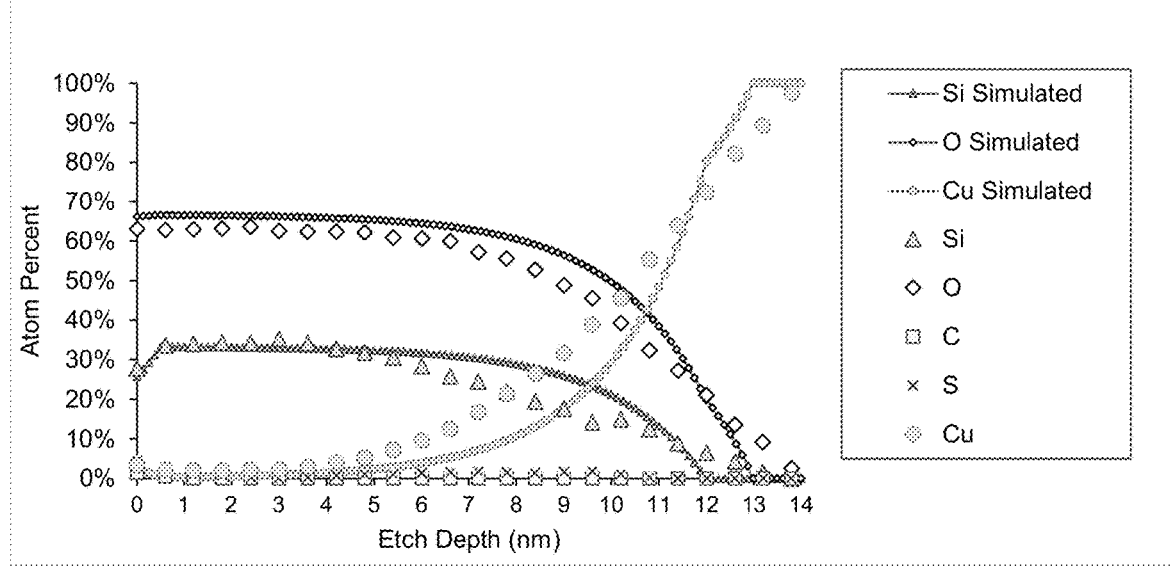
FIG. 4 depicts X-ray photoelectron spectroscopy (XPS) data for the film prepared on a copper substrate as described in Example 1.

FIG. 4 shows X-ray photoelectron spectroscopy (XPS) data demonstrating the deposition of a silicon dioxide layer on a copper substrate as described in Example 1.

FIG. 5 shows X-ray photoelectron spectroscopy (XPS) data demonstrating the deposition of a silicon dioxide layer on a cobalt substrate as described in Example 2.

Figure 6:
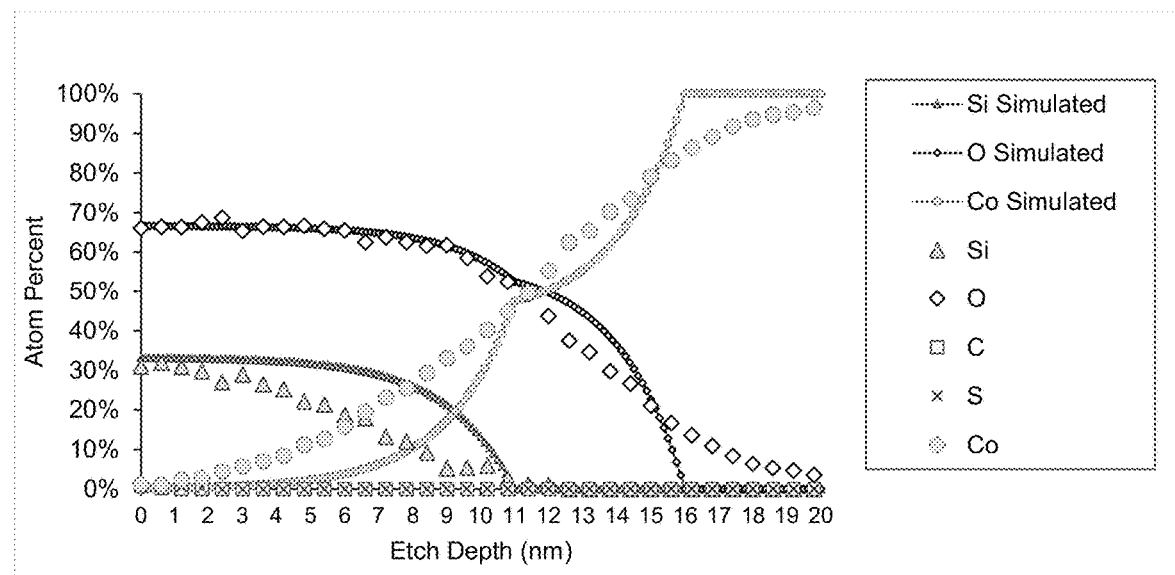
FIG. 6 depicts XPS data for the silicon dioxide layer on a cobalt substrate as described in Example 5.

FIG. 6 shows X-ray photoelectron spectroscopy (XPS) data demonstrating the deposition of a silicon dioxide layer on a cobalt substrate as described in Example 5.

Figure 7:
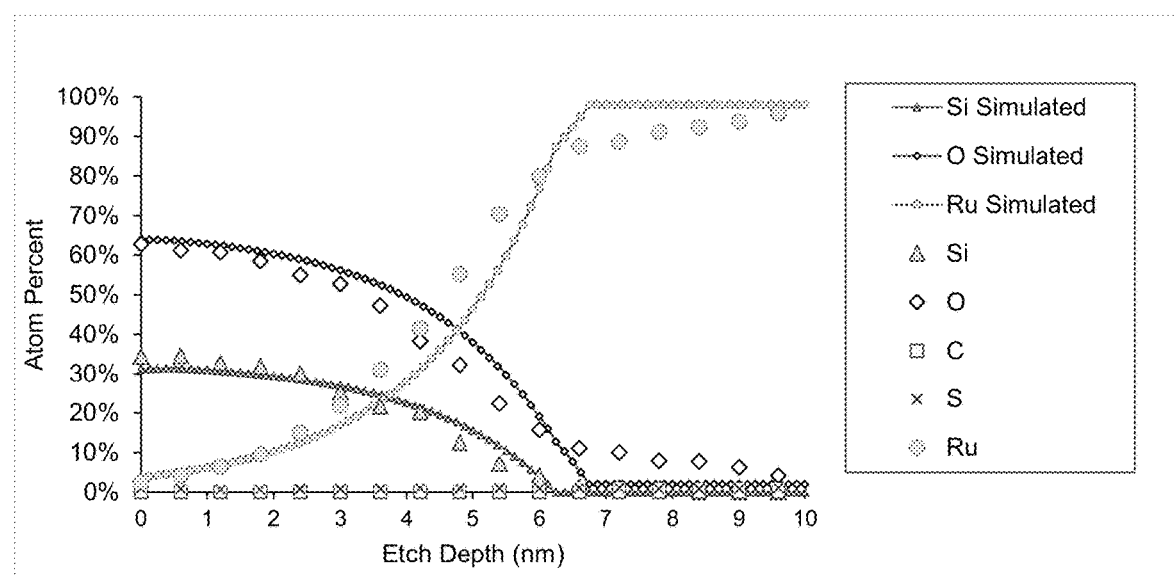
FIG. 7 depicts XPS data for the silicon dioxide layer on a ruthenium substrate as described in Example 6.

FIG. 7 shows X-ray photoelectron spectroscopy (XPS) data demonstrating the deposition of a silicon dioxide layer on a ruthenium substrate as described in Example 6.

Figure 8:
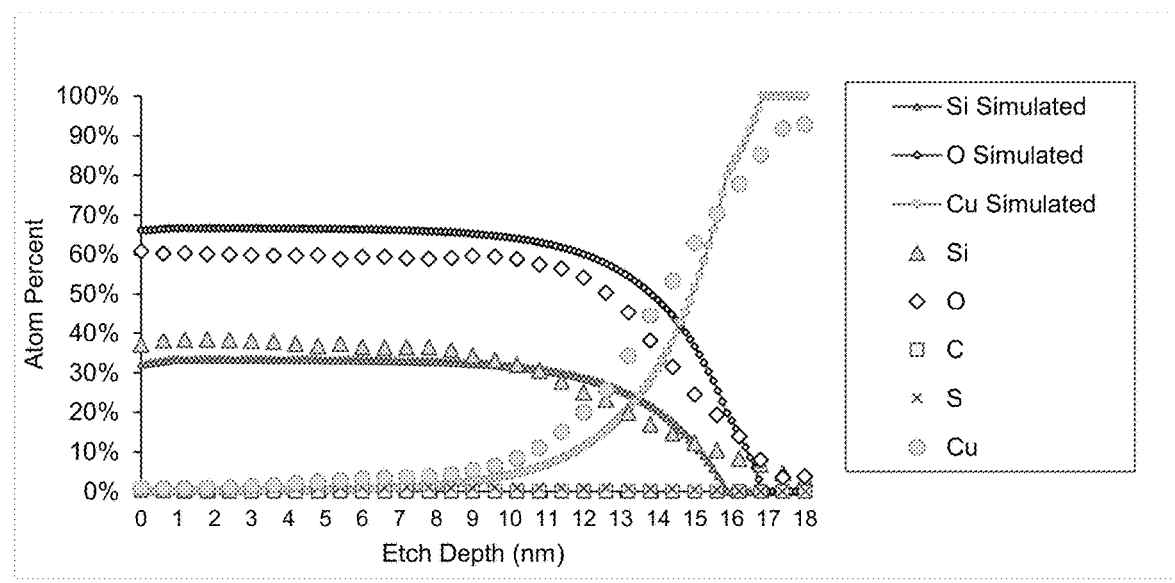
FIG. 8 depicts XPS data for the silicon dioxide layer on a copper substrate as described in Example 7.

FIG. 8 shows X-ray photoelectron spectroscopy (XPS) data demonstrating the deposition of a silicon dioxide layer on a copper substrate containing a silicon dioxide buffer layer described in Example 7.

Figure 9:
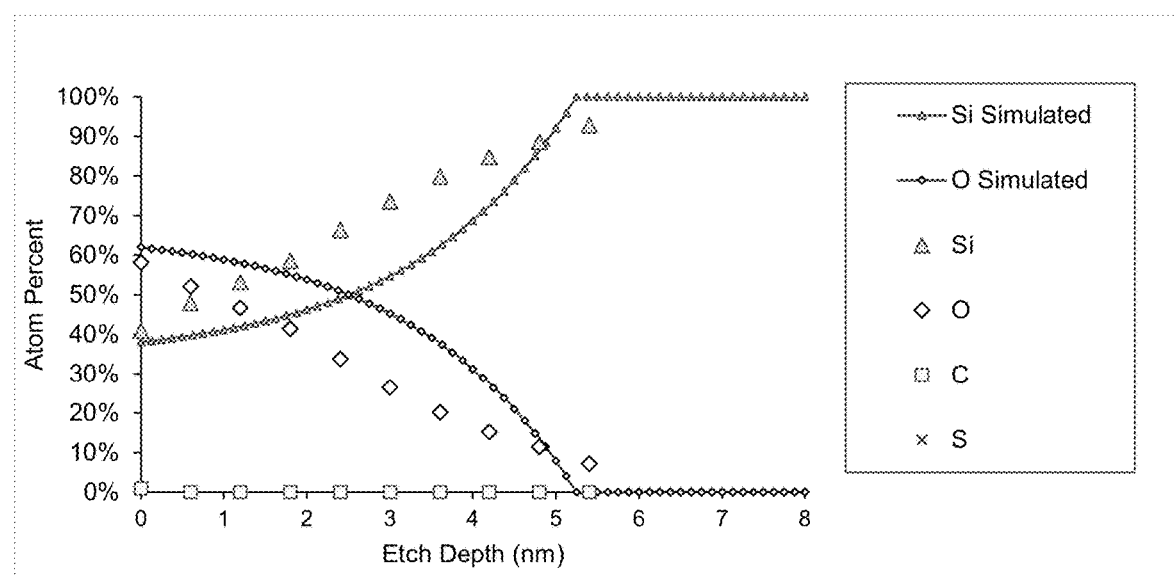
FIG. 9 depicts XPS data for the non-deposition of a silicon dioxide layer on a native oxide silicon substrate as described in Example 8.

FIG. 9 shows X-ray photoelectron spectroscopy (XPS) data demonstrating the non-deposition of a silicon dioxide layer on a native oxide silicon substrate as described in Example 8.

Figure 10:
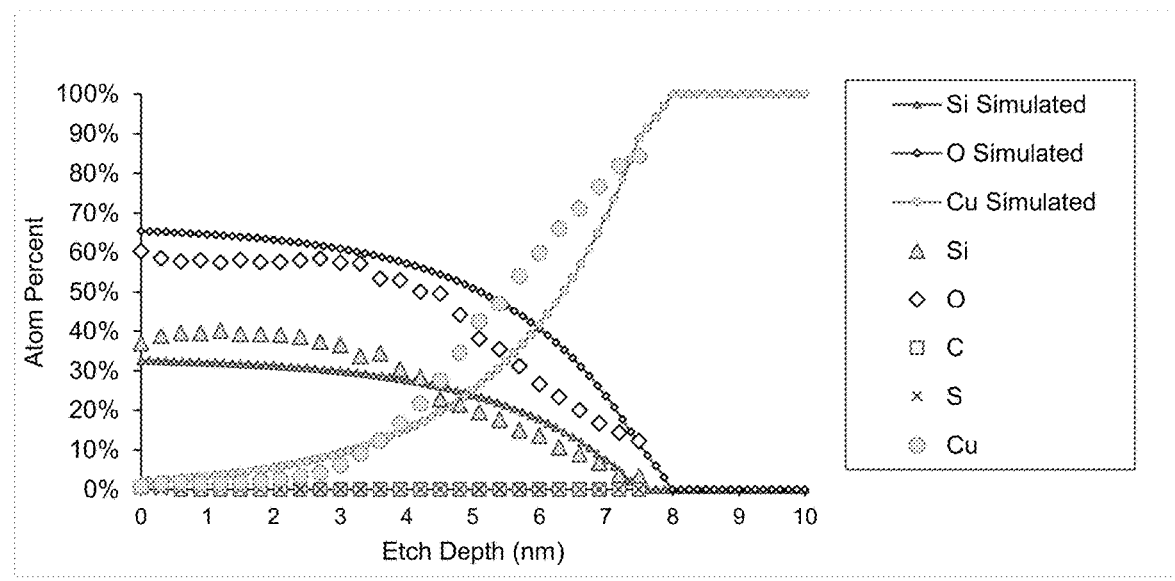
FIG. 10 depicts XPS data for the silicon dioxide/silicon oxynitride layer on a copper substrate as described in Example 9.

FIG. 10 shows X-ray photoelectron spectroscopy (XPS) data demonstrating the deposition of a silicon dioxide layer on a copper substrate containing a silicon oxynitride buffer layer described in Example 9.

FIG. 11 shows X-ray photoelectron spectroscopy (XPS) data demonstrating the non-deposition of a silicon dioxide layer on a silicon nitride substrate as described in Example 10 (inventive process), Comparative Example 11 (non-inventive process with oxidant only) and the substrate used in Example 10 before the inventive process. No additional deposition of silicon dioxide was observed with or without precursor exposure.

It will be appreciated by those skilled in the art that changes could be made to the embodiments described above without departing from the broad inventive concept thereof. It is understood, therefore, that this invention is not limited to the particular embodiments disclosed but it is intended to cover modifications within the spirit and scope of the present invention as defined by the appended claims.

We claim:

1. A method for selectively depositing a silicon-containing dielectric layer upon a patterned substrate, the method comprising:

(a) introducing a patterned substrate into a reaction zone of a deposition chamber, the patterned substrate comprising at least one metallic region and at least one isolated non-metallic region, wherein a temperature of the reaction zone is between about 25° C. and about 500° C.; and (b) forming a silicon-containing dielectric layer overlaying only the at least one metallic region of the patterned substrate via an atomic layer deposition process or a chemical vapor deposition process, wherein the patterned substrate is exposed to a compound comprising silicon and sulfur, and wherein the patterned substrate is exposed to an oxidant.

2. The method according to claim 1, wherein the silicon-containing dielectric layer forms upon the at least one metallic region of the patterned substrate at a thickness of at least about two nanometers and does not form upon the at least one non-metallic region of the patterned substrate or forms upon the at least one non-metallic region of the patterned substrate at a thickness of less than about one nanometer.

3. The method according to claim 1, wherein the compound comprising silicon and sulfur comprises at least one direct silicon-sulfur bond or a silicon and sulfur atom connected by a linear, branched, or cyclic, optionally substituted, alkylene, aryl, alkyne, alkene, ether, ester, or ketone having 1 to about 12 carbon atoms.

4. The method according to claim 3, wherein the silicon and sulfur containing compound has Formula 1, Formula 2, Formula 3, Formula 4, Formula 5, Formula 6, Formula 7, or Formula 8:

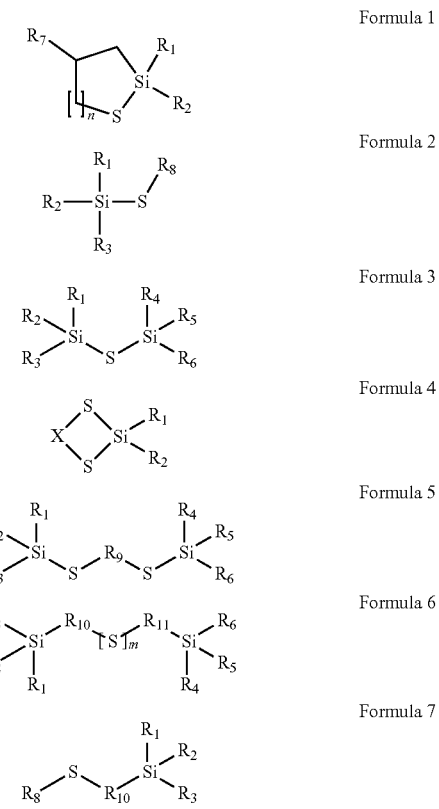

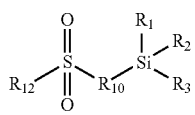

Formula 8 wherein n is an integer from about 1 to 4, m is an integer from about 1 to 6, $R_1$, $R_2$, $R_3$, $R_4$, $R_5$, $R_6$, and $R_7$ are each independently hydrogen or a linear, branched, or cyclic, optionally substituted, alkoxy, alkyl, aryl, alkyne, alkene, ether, ester, ketone, alkylthio, (alkyl)amino, (dialkyl)amino, alkyl(alkylamino), or alkyl(dialkylamino) group having 1 to about 12 carbon atoms; or a linear, branched, or cyclic, optionally substituted, silyl group having general formula $SiR_{13}R_{14}R_{15}$, $OSiR_{13}R_{14}R_{15}$, or $R_{16}SiR_{13}R_{14}R_{15}$ wherein $R_{13}$, $R_{14}$, and $R_{15}$ are each independently hydrogen or an alkyl or alkoxy group having about 1 to about 12 carbon atoms; and $R_{16}$ an linear or branched alkyl group having 1 to about 12 carbon atoms; $R_8$ is hydrogen or a linear, branched, or cyclic, optionally substituted, alkyl, aryl, alkyne, alkene, ether, ester, ketone, alkylthio, (alkyl)amino, (dialkyl)amino, alkyl(alkylamino), or alkyl(dialkylamino) group having 1 to about 12 carbon atoms; or a linear, branched, or cyclic, optionally substituted, silyl group having general formula $SiR_{13}R_{14}R_{15}$, or $R_{16}SiR_{13}R_{14}R_{15}$; $R_9$, $R_{10}$ and $R_{11}$ are each independently a linear, branched, or cyclic, optionally substituted, alkylene, aryl, alkyne, alkene, ether, ester, or ketone having 1 to about 12 carbon atoms; $R_{12}$ is OH, Cl, $NR_{17}R_{18}$, aryl or CN, wherein $R_{17}$ and $R_{18}$ are each independently hydrogen or a linear, branched, or cyclic, optionally substituted, alkyl, aryl, alkyne, alkene, ether, ester, or ketone having 1 to about 12 carbon atoms; and $X=Si(R_3,R_4)-(S-Si(R_5,R_6))_p$ or $(CH_2)_q$, wherein p is an integer from 0 to about 3 and q is an integer from about 1 to 4.

5. The method according to claim 4, wherein the compound of Formula 1, Formula 2, Formula 3, Formula 4, Formula 5, Formula 6, Formula 7, or Formula 8 is 2,2,4-trimethyl-1-thia-2-silacyclopentane, 2,2-dimethoxy-1-thia-2-silacyclopentane, 2,2-diethoxy-1-thia-2-silacyclopentane, bis(trimethylsilyl) sulfide, (mercaptomethyl)methyldiethoxysilane, trimethylsilanethiol, 2,2-methyl-1-thia-2-silacyclopentane, 2,2-dimethoxy-4-methyl-1-thia-2-silacyclopentane, 2,2-diethoxy-4-methyl-1-thia-2-silacyclopentane, silanethiol, triisopropylsilanethiol, trimethoxysilanethiol, triethoxysilanethiol, disilathiane, trimethyl(methylthio)silane, trimethyl(ethylthio)silane, 2,2-dimethyl-1,3-dithia-2-silacyclopentane, 2,2,4,4-tetramethylcyclodisilathiane, 2,2,8,8-tetramethyl-3,7-dithia-2,8-disilanonane, hexamethylcyclotrisilthiane, [(trimethylsilyl)thio]benzene, (3-mercaptopropyl)trimethoxysilane, [[(trimethylsilyl)thio]methyl]benzene, 2-(trimethylsilyl)ethanesulfonyl chloride, 2-(trimethylsilyl)ethanesulfonamide, (3-mercaptopropyl)triethoxysilane, 4-(dimethoxymethylsilyl)-1-butanethiol, 3-(trimethoxysilyl)-1-propanesulfonic acid, [[(trimethylsilyl)methyl]sulfonyl]benzene, bis[3-(triethoxysilyl)propyl] tetrasulfide, 1,1'-thiobis(methylene)bis[1,1,1-trimethylsilane], or 1-(diethoxymethylsilyl)methanethiol.

6. The method according to claim 5, wherein the compound comprising silicon and sulfur is 2,2,4-trimethyl-1-thia-2-silacyclopentane, 2,2-dimethoxy-1-thia-2-silacyclopentane, (mercaptomethyl)methyldiethoxysilane, or 2,2-diethoxy-1-thia-2-silacyclopentane.

7. The method according to claim 1, wherein the patterned substrate is exposed to the compound comprising silicon and sulfur and to the oxidant simultaneously.

8. The method according to claim 1, wherein the patterned substrate is exposed to the compound comprising silicon and sulfur and to the oxidant sequentially.

9. The method according to claim 1, further comprising prior to step (b): performing an anneal, clean, etch, or plasma treatment on the patterned substrate.

10. The method according to claim 1, further comprising prior to step (b): exposing the patterned substrate to a chemical blocking agent to selectively passivate at least one region of the substrate.

11. The method according to claim 1, wherein the oxidant is a plasma generated from a gas mixture comprising at least one of $O_2$, $H_2O$, $H_2O_2$, $O_3$, $CO_2$, $N_2O$, and $NO_2$ and optionally a carrier gas comprising $N_2$, Ar or He.

12. The method according to claim 1, wherein the silicon-containing dielectric layer has a thickness of about 2 nm to about 20 nm.

13. The method according to claim 12, wherein the silicon-containing dielectric layer has a thickness of about 3 nm to about 10 nm.

14. The method according to claim 1, wherein the temperature of the reaction zone is about 75° C. to about 300° C.

15. The method according to claim 1, wherein the patterned substrate comprises silicon dioxide, silicon oxycarbide, silicon oxynitride, silicon carboxynitride, silicon oxyfluoride, silicon nitride, silicon carbon nitride, silicon carbide borosilicate, carbon, or alumina.

16. The method according to claim 1, wherein the silicon-containing dielectric layer selectively grows on at least one area of the patterned substrate comprising copper, cobalt, ruthenium, molybdenum, tungsten, and/or gold.

17. The method according to claim 1, wherein the deposited film has a dielectric constant less than about 10.

18. The method according to claim 17, wherein the deposited film has a dielectric constant less than about 5.

19. The method according to claim 1, wherein an atomic layer deposition process is used to form the silicon-containing dielectric layer.

20. The method according to claim 19, wherein the atomic layer deposition process comprises:
 (b1) exposing the patterned substrate to a pulse of the compound comprising silicon and sulfur;
 (b2) optionally purging the deposition chamber;
 (b3) exposing the patterned substrate to the oxidant;
 (b4) optionally purging the deposition chamber; and
 (b5) repeating steps (b1) to (b4) until a desired layer thickness is reached.

21. The method according to claim 20, further comprising prior to step (b1): performing an anneal, clean, etch, or plasma treatment on the patterned substrate and/or exposing the patterned substrate to a chemical blocking agent to selectively passivate at least one region of the substrate.

22. The method according to claim 20, further comprising after step (b5): performing an anneal, clean, etch, or plasma treatment on the patterned substrate and/or exposing the patterned substrate to a chemical blocking agent to selectively passivate at least one region of the substrate.

23. The method according to claim 20, wherein the pulse of the compound comprising silicon and sulfur has a duration of about 0.05 seconds to about 30 seconds.

24. The method according to claim 23, wherein the pulse of the compound comprising silicon and sulfur has a duration of about 3 seconds to about 10 seconds.

25. The method according to claim 20, wherein the patterned substrate is exposed to the oxidant for about 0.5 seconds to about 60 seconds.

26. The method according to claim 25, wherein the patterned substrate is exposed to the oxidant for about 5 seconds to about 20 seconds.

27. The method according to claim 1, wherein a chemical vapor deposition process or pulsed chemical vapor deposition process is used to form the silicon-containing dielectric layer.

28. The method according to claim 27, wherein the chemical vapor deposition or pulsed chemical vapor deposition process comprises:
(b1) exposing the patterned substrate to the compound comprising silicon and sulfur while simultaneously exposing the patterned substrate to the oxidant until a desired layer thickness is reached; and
(b2) repeating step (b1) until a second desired layer thickness is reached.

29. A method for selectively depositing a silicon-containing dielectric layer upon a substrate, the method comprising:
(a) introducing a patterned substrate into a reaction zone of a deposition chamber, the patterned substrate having a first layer and a second layer, the first layer comprising at least one metallic region and at least one isolated non-metallic region, and the second layer comprising a buffer material, wherein a temperature of the reaction zone is between about 25° C. and about 500° C.; and
(b) forming a silicon-dielectric layer upon the second layer of the patterned substrate and overlaying only the at least one metallic region of the first layer via an atomic layer deposition process or a chemical vapor deposition process, wherein the patterned substrate is exposed to a compound comprising silicon and sulfur, and wherein the patterned substrate is exposed to an oxidant.

30. The method according to claim 29, wherein the compound comprising silicon and sulfur has one of Formula 1 to 8:

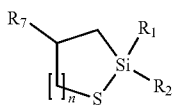

Formula 1

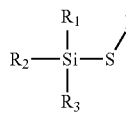

Formula 2

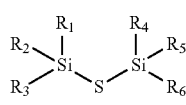

Formula 3

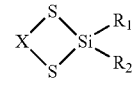

Formula 4

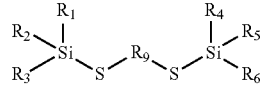

Formula 5

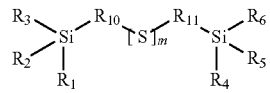

Formula 6

-continued

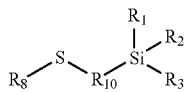

Formula 7

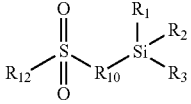

Formula 8 wherein n is an integer from about 1 to 4, m is an integer from about 1 to 6, $R_1$, $R_2$, $R_3$, $R_4$, $R_5$, $R_6$, and $R_7$ are each independently hydrogen or a linear, branched, or cyclic, optionally substituted, alkoxy, alkyl, aryl, alkyne, alkene, ether, ester, ketone, alkylthio, (alkyl)amino, (dialkyl)amino, alkyl(alkylamino), or alkyl(dialkylamino) group having 1 to about 12 carbon atoms; or a linear, branched, or cyclic, optionally substituted, silyl group having general formula $SiR_{13}R_{14}R_{15}$, $OSiR_{13}R_{14}R_{15}$, or $R_{16}SiR_{13}R_{14}R_{15}$ wherein $R_{13}$, $R_{14}$, and $R_{15}$ are each independently hydrogen or an alkyl or alkoxy group having about 1 to about 12 carbon atoms; and $R_{16}$ an linear or branched alkyl group having 1 to about 12 carbon atoms; $R_8$ is hydrogen or a linear, branched, or cyclic, optionally substituted, alkyl, aryl, alkyne, alkene, ether, ester, ketone, alkylthio, (alkyl)amino, (dialkyl)amino, alkyl(alkylamino), or alkyl(dialkylamino) group having 1 to about 12 carbon atoms; or a linear, branched, or cyclic, optionally substituted, silyl group having general formula $SiR_{13}R_{14}R_{15}$, or $R_{16}SiR_{13}R_{14}R_{15}$; $R_9$, $R_{10}$ and $R_{11}$ are each independently a linear, branched, or cyclic, optionally substituted, alkylene, aryl, alkyne, alkene, ether, ester, or ketone having 1 to about 12 carbon atoms; $R_{12}$ is OH, Cl, $NR_{17}R_{18}$, aryl or CN, wherein $R_{17}$ and $R_{18}$ are each independently hydrogen or a linear, branched, or cyclic, optionally substituted, alkyl, aryl, alkyne, alkene, ether, ester, or ketone having 1 to about 12 carbon atoms; and $X=Si(R_3,R_4)$—$(S-Si(R_5,R_6))_p$ or $(CH_2)_q$, wherein p is an integer from 0 to about 3 and q is an integer from about 1 to 4.

31. The method according to claim 30, wherein the compound of Formula 1, Formula 2, Formula 3, Formula 4, Formula 5, Formula 6, Formula 7, or Formula 8 is 2,2,4-trimethyl-1-thia-2-silacyclopentane, 2,2-dimethoxy-1-thia-2-silacyclopentane, 2,2-diethoxy-1-thia-2-silacyclopentane, bis(trimethylsilyl) sulfide, (mercaptomethyl)methyldiethoxysilane, trimethylsilanethiol, 2,2-methyl-1-thia-2-silacyclopentane, 2,2-dimethoxy-4-methyl-1-thia-2-silacyclopentane, 2,2-diethoxy-4-methyl-1-thia-2-silacyclopentane, silanethiol, triisopropylsilanethiol, trimethoxysilanethiol, triethoxysilanethiol, disilathiane, trimethyl(methylthio)silane, trimethyl(ethylthio)silane, 2,2-dimethyl-1,3-dithia-2-silacyclopentane, 2,2,4,4-tetramethylcyclodisilathiane, 2,2,8,8-tetramethyl-3,7-dithia-2,8-disilanonane, hexamethylcyclotrisilthiane, [(trimethylsilyl)thio]benzene, (3-mercaptopropyl)trimethoxysilane, [[(trimethylsilyl)thio]methyl]benzene, 2-(trimethylsilyl)ethanesulfonyl chloride, 2-(trimethylsilyl)ethanesulfonamide, (3-mercaptopropyl)triethoxysilane, 4-(dimethoxymethylsilyl)-1-butanethiol, 3-(trimethoxysilyl)-1-propanesulfonic acid, [[(trimethylsilyl)methyl]sulfonyl]benzene, bis[3-(triethoxysilyl)propyl] tetrasulfide, 1,1'-thiobis(methylene)bis[1,1,1-trimethylsilane], or 1-(diethoxymethylsilyl)methanethiol.

32. The method according to claim 31, wherein the compound comprising silicon and sulfur is 2,2,4-trimethyl-1-thia-2-silacyclopentane, 2,2-dimethoxy-1-thia-2-silacyclopentane, (mercaptomethyl)methyldiethoxysilane, or 2,2-diethoxy-1-thia-2-silacyclopentane.

33. The method according to claim 29, wherein the at least one metallic region comprises copper, cobalt, ruthenium, molybdenum, tungsten, and/or gold and the second layer has a thickness of less than about 10 nm.

34. The method according to claim 29, wherein the at least one metallic region comprises copper, cobalt, ruthenium, molybdenum, tungsten, and/or gold and the second layer has a thickness of less than about 5 nm.

35. The method according to claim 29, wherein the second layer comprises a semiconductor, oxide, nitride, or mixture thereof.

36. The method according to claim 35, wherein the second layer comprises silicon, germanium, aluminum oxide, silicon dioxide, silicon oxycarbide, silicon nitride, silicon oxynitride, silicon carboxynitride, silicon carbide, tantalum nitride, titanium nitride, copper oxide, cobalt oxide, ruthenium oxide, molybdenum oxide, tungsten oxide, or mixtures thereof.

37. The method according to claim 29, wherein the oxidant is a plasma generated from a gas mixture comprising at least one of $O_2$, $H_2O$, $H_2O_2$, $O_3$, $CO_2$, $N_2O$, and $NO_2$ and optionally a carrier gas comprising $N_2$, Ar or He.

* * * * *